United States Patent
Nakayama et al.

(10) Patent No.: US 9,350,345 B2
(45) Date of Patent: May 24, 2016

(54) INPUT DEVICE, DISPLAY DEVICE, AND ELECTRONIC APPARATUS

(71) Applicant: KYOCERA Corporation, Kyoto-shi, Kyoto (JP)

(72) Inventors: Masahito Nakayama, Kirishima (JP); Kouji Tsurusaki, Kirishima (JP); Junji Furue, Kirishima (JP); Yuuichi Ashida, Kusatsu (JP); Takashi Minami, Minamikusatsu (JP); Yoshio Miyazaki, Kirishima (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 159 days.

(21) Appl. No.: 14/348,246

(22) PCT Filed: Sep. 26, 2012

(86) PCT No.: PCT/JP2012/074670
§ 371 (c)(1),
(2) Date: Mar. 28, 2014

(87) PCT Pub. No.: WO2013/047572
PCT Pub. Date: Apr. 4, 2013

(65) Prior Publication Data
US 2015/0009428 A1    Jan. 8, 2015

(30) Foreign Application Priority Data

Sep. 29, 2011  (JP) .................................. 2011-214815
Oct. 11, 2011  (JP) .................................. 2011-224051

(51) Int. Cl.
*G06F 3/041* (2006.01)
*H03K 17/96* (2006.01)
(Continued)

(52) U.S. Cl.
CPC ........ *H03K 17/9622* (2013.01); *G02F 1/13338* (2013.01); *G06F 3/044* (2013.01); *H01L 27/323* (2013.01); *H03K 2017/9613* (2013.01); *H03K 2217/960765* (2013.01)

(58) Field of Classification Search
CPC .......... G06F 3/044; G06F 2203/04111; H03K 17/9622; H03K 2017/9613; H03K 2217/960765; G02F 1/13338; H01L 27/323

USPC .......................................................... 345/174
See application file for complete search history.

(56) References Cited

U.S. PATENT DOCUMENTS 6,249,082 B1    6/2001  Fukuyoshi et al.
2011/0032207 A1*  2/2011  Huang .................... G06F 3/044
                                                     345/174
(Continued)

FOREIGN PATENT DOCUMENTS

| JP | 1-109610 A | 4/1989 |
| JP | 11-282383 A | 10/1999 |
| JP | 2008097283 A | 4/2008 |
| JP | 2008310551 A | 12/2008 |

(Continued)

OTHER PUBLICATIONS

Japanese Office Action with English concise explanation, Japanese Patent Application 2013-536324, Feb. 24, 2015, 5 pgs.

(Continued)

*Primary Examiner* — Jonathan Boyd
(74) *Attorney, Agent, or Firm* — Volpe and Koenig, P.C.

(57) ABSTRACT

An input device, a display device and an electronic apparatus are disclosed. The input device includes a substrate with a main surface. First and second detection electrodes, first and second connecting electrodes, first and second insulating layer are disposed on the main surface. The first and second detection electrodes are aligned in first and second directions, respectively. The first connecting electrodes each connect two of the neighboring first detection electrodes. The second connecting electrodes each connect two of the neighboring second detection electrodes. The first insulating layer is located on the first connecting electrode. The second insulating layer is disposed between the main surface of the substrate, and at least one of the first and second detection electrodes and the first connecting electrodes. The second insulating layer separates the main surface from the at least one of the first and second detection electrodes and the first connecting electrodes.

11 Claims, 20 Drawing Sheets

(51) Int. Cl.
*G06F 3/044* (2006.01)
*G02F 1/1333* (2006.01)
*H01L 27/32* (2006.01)

(56) References Cited

U.S. PATENT DOCUMENTS

2011/0074730 A1 3/2011 Nagata et al.
2012/0047956 A1* 3/2012 Li .................. C03B 33/091
                                           65/112

FOREIGN PATENT DOCUMENTS

| JP | 2011039758 A | 2/2011 |
| JP | 2011090443 A | 5/2011 |
| JP | 2011096234 A | 5/2011 |
| JP | 2011159094 A | 8/2011 |
| JP | 2011164508 A | 8/2011 |

OTHER PUBLICATIONS

International Search Report, PCT/JP2012/074670, Dec. 11, 2012, 2 pp.

* cited by examiner

Fig. 4
(a)
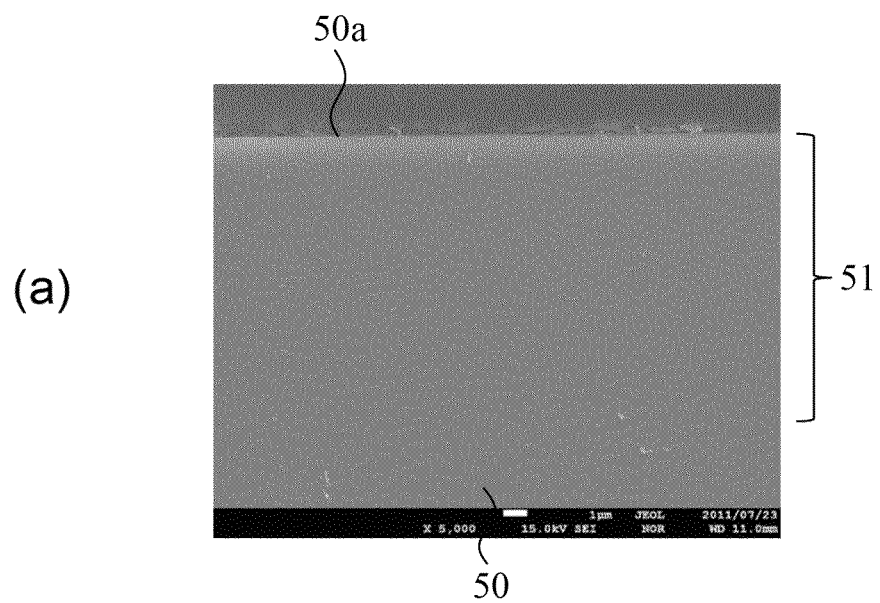
(b)
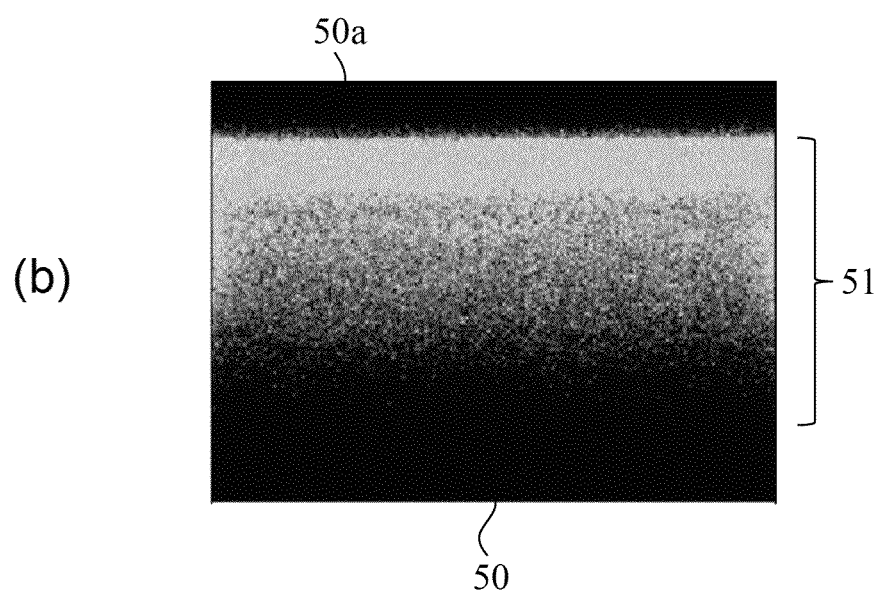

INPUT DEVICE, DISPLAY DEVICE, AND ELECTRONIC APPARATUS

TECHNICAL FIELD

The present invention relates to an input device, a display device, and an electronic apparatus.

BACKGROUND ART

Capacitive touch panels with which an input position is detected by a change in capacitance between a finger and a detection electrode are known as the input devices (for example, refer to PTL 1 and PTL 2), for example.

An input device of this type includes a substrate having a main surface, first detection electrodes disposed on the main surface of the substrate and aligned in a first direction, and second detection electrodes disposed on the main surface of the substrate and aligned in a second direction. The input device also includes a first connecting electrode that is disposed on the main surface of the substrate and connects the first detection electrodes adjacent to each other, an insulating layer disposed on the main surface of the substrate and positioned on the first connecting electrode, and a second connecting electrode that is disposed on the insulating layer and connects the second detection electrodes adjacent to each other.

However, there was a possibility that the strength of the substrate of such an input device would be degraded since the first detection electrodes, the second detection electrodes, and the first connecting electrode are directly formed on the main surface of the substrate.

[PTL 1] Japanese Unexamined Patent Application Publication No. 2008-97283

[PTL 2] Japanese Unexamined Patent Application Publication No. 2008-310551

SUMMARY OF INVENTION

The present invention has been made to address the aforementioned issue, and an object thereof is related to an input device, a display device, and an electronic apparatus with which the possibility of the decrease in strength of the substrate can be lowered.

An embodiment of an input device according to the present invention includes: a substrate including a main surface; first detection electrodes provided on the main surface of the substrate and aligned in a first direction; second detection electrodes provided on the main surface of the substrate and aligned in a second direction; first connecting electrodes provided on the main surface of the substrate and connecting the first detection electrodes next to each other; a first insulating layer provided on the main surface of the substrate and positioned on the first connecting electrode, second connecting electrodes provided on the first insulating layer and connecting the second detection electrodes next to each other; and a second insulating layer provided between the main surface of the substrate and at least one of the first detection electrodes, the second detection electrodes, and the first connecting electrodes, the second insulating layer separating the main surface of the substrate from the at least one of the first detection electrodes, the second detection electrodes, and the first connecting electrodes.

An embodiment of a display device according to the present invention includes the input device described above, a display panel arranged to face the input device, and a casing that houses the display panel.

An embodiment of an electronic apparatus according to the present invention includes the display device described above.

BRIEF DESCRIPTION OF DRAWINGS

FIG. 4(a) is a diagram obtained by observation of a cross section of a glass substrate with a scanning electron microscope and FIG. 4(b) is a diagram showing a potassium ion concentration distribution observed by electron beam microanalysis on the cross section of the glass substrate.

In FIG. 5(a), an electrode is disposed on a part of a main surface.

In FIG. 5(b) also, an electrode is formed on a part of the main surface.

In FIG. 6, an insulating layer is disposed on a main surface of the glass substrate and an electrode is disposed on the insulating layer.

DESCRIPTION OF EMBODIMENTS

Figure 1:
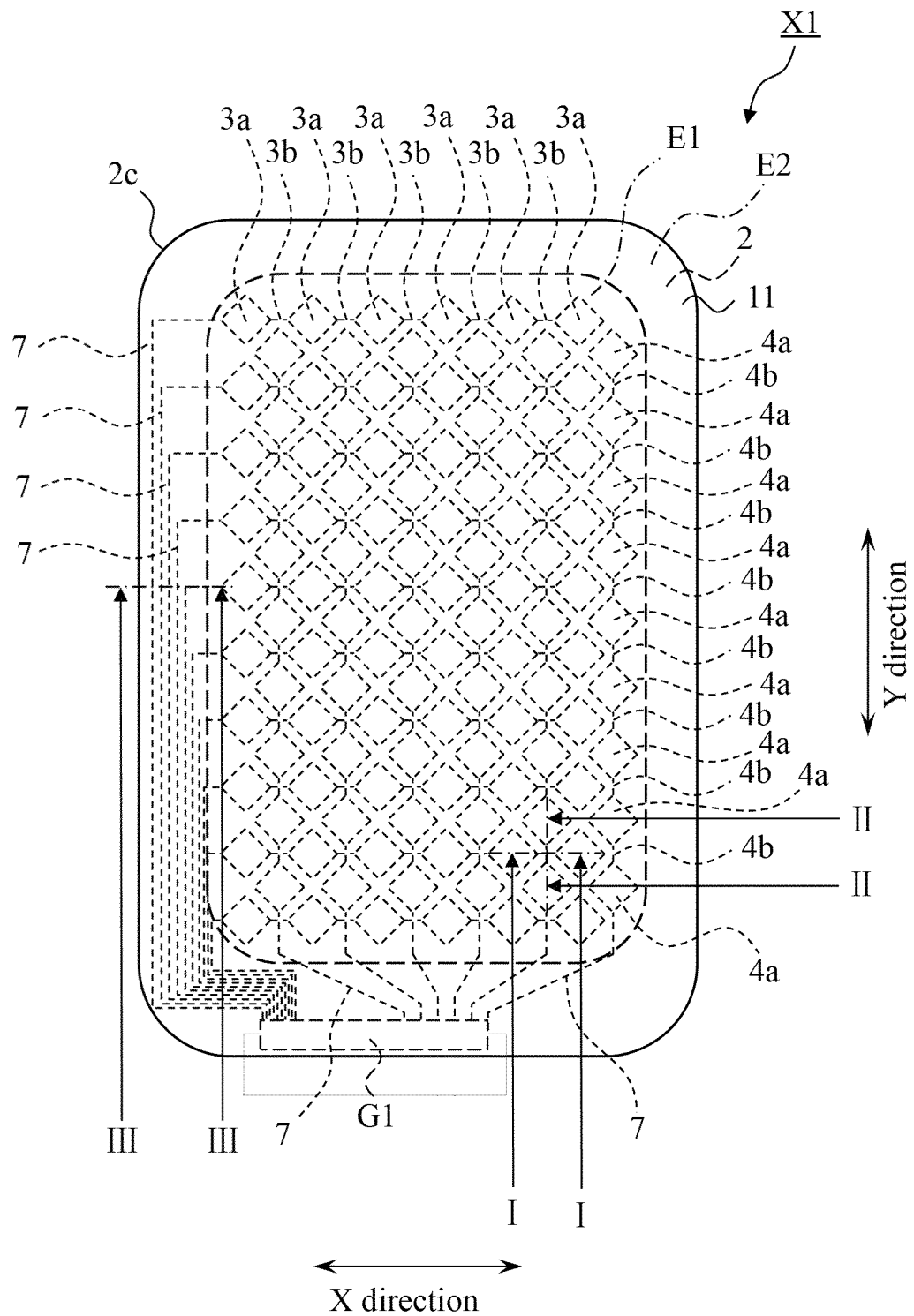
FIG. 1 is a plan view showing a schematic structure of an input device according to a first embodiment of the present invention.

Embodiments of the present invention will now be described with reference to drawings.

It should be noted that for the sake of convenience, the drawings referred to in the description below provide simplified representations of main components needed to explain the present invention among the structural components of an embodiment of the present invention. Accordingly, the input device, the display device, and the electronic apparatus according to the present invention may each include any structural component not shown in the drawings referred to in this specification.

First Embodiment

Referring to FIG. 1, an input device X1 according to this embodiment is a capacitive touch panel. The input device X1 has an input region E1 and a non-input region E2. The input region E1 allows a user to perform an input operation. The non-input region E2 does not allow a user to perform an input operation. The non-input region E2 according to this embodiment is located outside the input region E1 so as to surround the input region E1 but is not limited to this region. For example, the non-input region E2 may be located within the input region E1.

Figure 2:
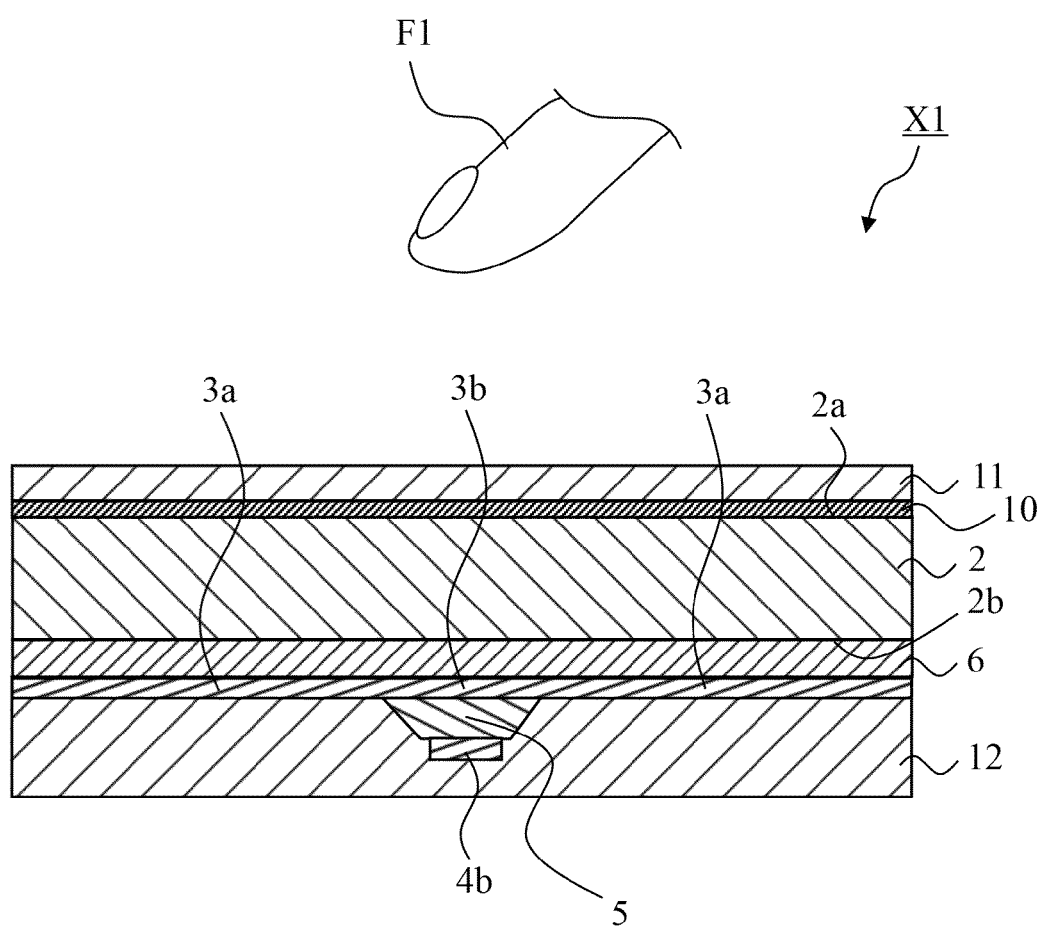
FIG. 2 is a cross-sectional view taken along line I-I in FIG. 1.
Figure 3:
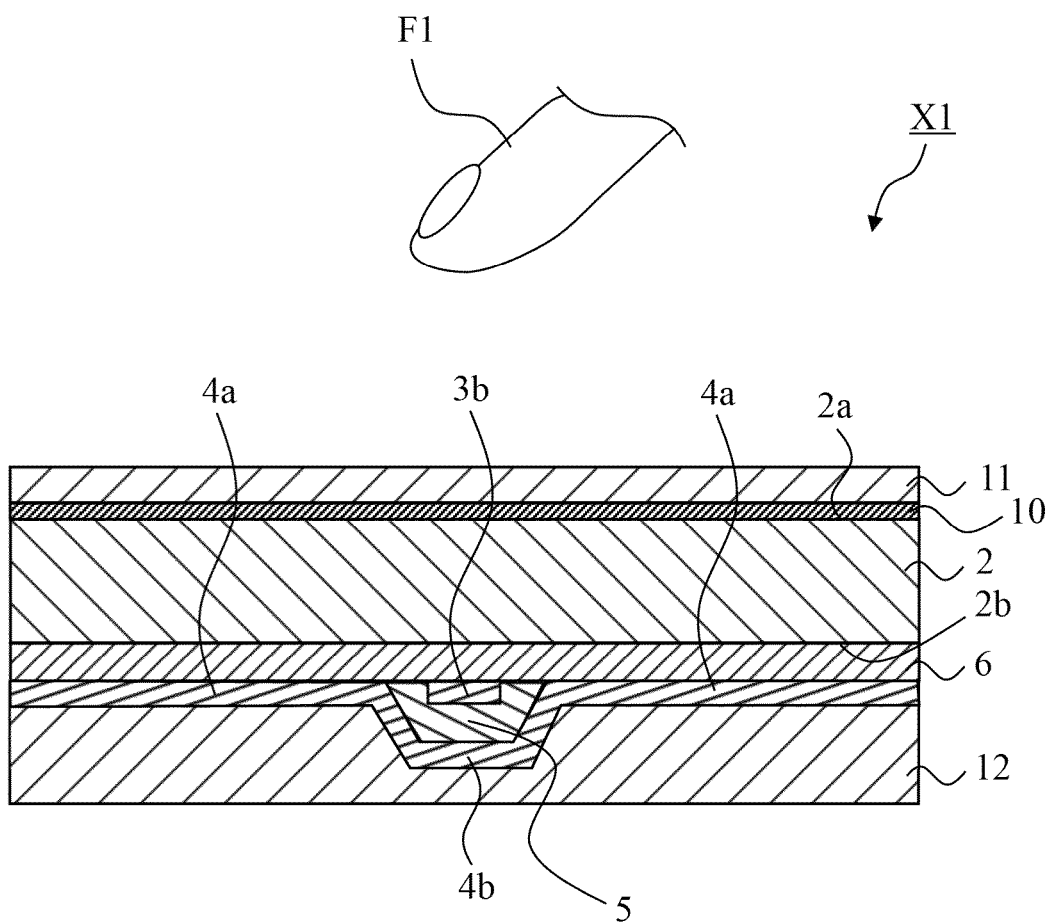
FIG. 3 is a cross-sectional view taken along line II-II in FIG. 1.

As shown in FIGS. 1 to 3, the input device X1 includes a substrate 2.

The substrate 2 supports first detection electrodes 3a, first connecting electrodes 3b, second detection electrodes 4a, and second connecting electrodes 4b in the input region E1. The substrate 2 supports detection wires 7 in the non-input region E2. The substrate 2 has a first main surface 2a, a second main surface 2b, and an end surface 2c. The first main surface 2a is a surface on which an input operation is performed by a user through a protective sheet 11 described below. The second main surface 2b is a surface opposite of the first main surface 2a. The end surface 2c is the surface adjacent to the first main surface 2a and the second main surface 2b.

The substrate 2 has an insulating property. The substrate 2 has optical transparency to light incident in a direction intersecting the first main surface 2a and the second main surface 2b. It should be noted that, in this specification, the "optical transparency" means transparency for visible light. Although the contour of the substrate 2 of this embodiment is substantially rectangular with rounded corners in a plan view, the contour is not limited to this. The corners need not be rounded and the contour of the substrate 2 may be circular or triangular, for example, in a plan view.

Examples of the material constituting the substrate 2 include those having optical transparency such as glass or plastic. Among these, glass is preferable from the viewpoint of visibility. Among various types of glasses, a strengthened glass is particularly preferable from the viewpoint of improving the strength of the substrate 2. Thus, in this embodiment, a strengthened glass chemically strengthened by ion exchange is used as a material constituting the substrate 2. In the case where the substrate 2 is formed of a strengthened glass, the substrate 2 is produced by the following method, for example.

That is, a glass is brought into contact with an aqueous solution containing potassium ions and heated to substitute sodium ions present in the surface layer of the glass by potassium ions. As the sodium ions present in the surface layer of the glass are substituted by potassium ions, a compression stress layer is formed on the surface layer of the glass. In other words, because potassium ions have a larger particle diameter than the sodium ions, potassium ions occupying holes formed by removal of the sodium ions help achieve higher compression stress on a molecular level. As a result, a chemically strengthened substrate 2 is obtained.

As shown in FIGS. 1 to 3, the first detection electrodes 3a, the first connecting electrodes 3b, the second detection electrodes 4a, the second connecting electrodes 4b, and first insulating layers 5 are formed on the second main surface 2b of the substrate 2 corresponding to the input region E1.

The first detection electrodes 3a each have a function of generating a capacitance between the electrode and a finger F1. The first detection electrode 3a detects a Y-direction position of the input made by the user's finger F1 near the input region E1. The first detection electrodes 3a are disposed on the second main surface 2b of the substrate 2 and spaced from each other by particular gaps therebetween in an X direction (first direction). Although the shape of the first detection electrodes 3a in this embodiment is substantially rhombic in a plan view from the standpoint of improving detection sensitivity, the shape is not limited to this.

The first connecting electrodes 3b electrically connects adjacent first detection electrodes 3a to each other. The first connecting electrodes 3b are disposed on the second main surface 2b of the substrate 2.

The second detection electrodes 4a each have a function of generating a capacitance between the electrode and the finger F1. The second detection electrodes 4a detect an X-direction position of the input made by the user's finger F1 near the input region E1. The second detection electrodes 4a are disposed on the second main surface 2b of the substrate 2 and spaced from each other by particular gaps therebetween in a Y direction (second direction). Although the shape of the second detection electrodes 4a in this embodiment is substantially rhombic in a plan view from the standpoint of improving detection sensitivity, the shape is not limited to this.

The second connecting electrodes 4b electrically connect the second detection electrodes 4a adjacent to each other. Each second connecting electrode 4b is disposed on the first insulating layer 5 so as to cross the first insulating layer 5 and be electrically insulated from the first connecting electrode 3b. The first insulating layer 5 is disposed on the second main surface 2b of the substrate 2 so as to cover the first connecting electrode 3b. Examples of the material constituting the first insulating layer 5 include transparent resins such as acrylic resins, epoxy resins, silicone resins, and urethane resins. Examples of the method for forming the first insulating layer 5 include a transfer printing method, a spin coating method, and a slit coating method.

Examples of the material constituting the first detection electrodes 3a, the first connecting electrodes 3b, the second detection electrodes 4a, and the second connecting electrodes 4b include electrically conductive materials having optical transparency. Examples of the electrically conductive materials having optical transparency include ITO (indium tin oxide), IZO (indium zinc oxide), ATO (antimony tin oxide), AZO (Al-doped zinc oxide), tin oxide, zinc oxide, and conductive polymers.

The first detection electrodes 3a, the first connecting electrodes 3b, the second detection electrodes 4a, and the second connecting electrodes 4b are formed by, for example, forming films of the above-described materials on the second main surface 2b of the substrate 2 by a sputtering method, a vapor deposition method, or a CVD (chemical vapor deposition)

method. A photosensitive resin is applied to a surface of the resulting film and the resulting film is patterned through exposure, development, and etching steps. As a result, the first detection electrodes 3a, the first connecting electrodes 3b, the second detection electrodes 4a, and the second connecting electrodes 4b are formed.

Referring to FIGS. 2 and 3, a second insulating layer 6 is disposed between the first detection electrodes 3a and the second main surface 2b of the substrate 2 and between the second detection electrodes 4a and the second main surface 2b of the substrate 2. The second insulating layer 6 is also disposed between the first connecting electrodes 3b and the second main surface 2b of the substrate 2. In this embodiment, the second insulating layer 6 is disposed on the substantially entire second main surface 2b of the substrate 2 corresponding to the input region E1. In this specification, "substantially" is a concept that includes production errors and the like.

Since the second insulating layer 6 is formed between the first detection electrodes 3a and the second main surface 2b of the substrate 2 and between the second detection electrodes 4a and the second main surface 2b of the substrate 2, the first detection electrodes 3a and the second detection electrodes 4a are separated from the second main surface 2b of the substrate 2. Since the second insulating layer 6 is disposed between the second main surface 2b of the substrate 2 and the first connecting electrodes 3b, the second main surface 2b of the substrate 2 becomes separated from the first connecting electrodes 3b.

The second insulating layer 6 lowers the possibility of the decrease in strength of the substrate 2. Examples of the material constituting the second insulating layer 6 are the same as those for the first insulating layers 5. Examples of the method for forming the second insulating layer 6 are also the same as those for the first insulating layers 5.

Figure 5:
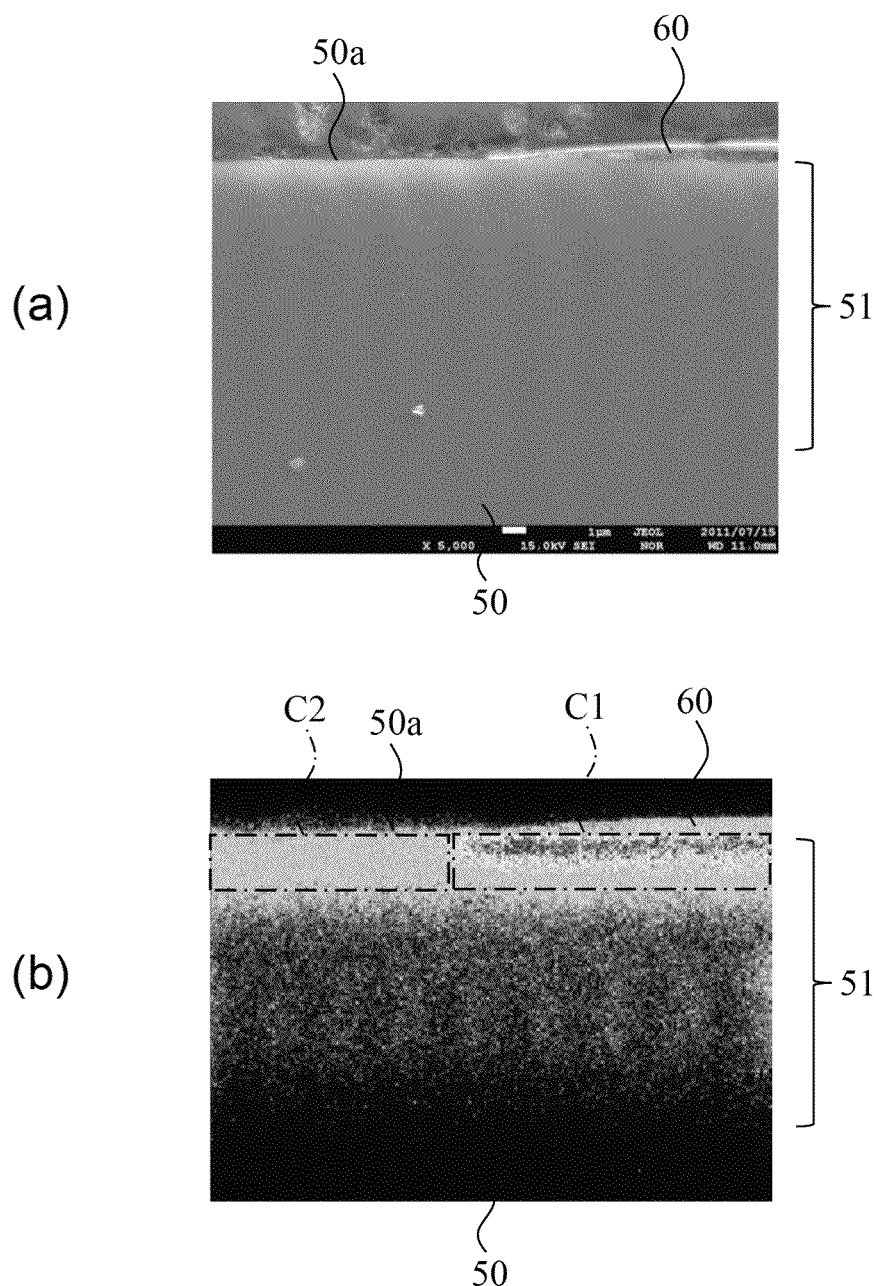
FIG. 5(a) is a diagram obtained by observation of a cross section of a glass substrate with a scanning electron microscope.
FIG. 5(b) is a diagram showing a potassium ion concentration distribution observed by electron beam microanalysis on the cross section of the glass substrate.

Consider a conventional input device in which first detection electrodes, second detection electrodes, and first connecting electrodes are directly formed on a second main surface of a substrate. Because the first detection electrodes, the second detection electrodes, and the first connecting electrodes are directly formed on the second main surface of the substrate in the conventional input device, there was a possibility that the strength of the substrate would be lowered. The reason for this is described below with reference to FIGS. 4 and 5.

FIG. 4(a) is an image of a cross section of a glass substrate 50 observed with a scanning electron microscope. FIG. 4(b) shows the potassium ion concentration distribution found by electron beam microanalysis on the cross section of the glass substrate 50. FIG. 4(b) and FIG. 4(b) show the same section. Here, as with the substrate 2 of the present embodiment, a strengthened glass chemically strengthened by ion exchange is used as the glass substrate 50. In both FIGS. 4(a) and (b), no electrodes are formed on a main surface 50a of the glass substrate 50. The glass substrate 50 is a glass substrate in an original state.

As shown in FIGS. 4(a) and 4(b), a compression stress layer 51 is formed in the glass substrate 50 from the main surface 50a down to a certain depth. In this embodiment, this certain depth is 17 μm. As shown in FIG. 4(b), no electrodes are formed on the main surface 50a of the glass substrate 50. It can be understood that potassium ions are evenly distributed in the compression stress layer 51 if the glass substrate 50 is a glass substrate in an original state.

FIG. 5(a) is an image of a cross section of the glass substrate 50 observed with a scanning electron microscope. In FIG. 5(a), an electrode 60 is formed on a part of the main surface 50a. FIG. 5(b) shows the potassium ion concentration distribution found by electron beam microanalysis on the cross section of the glass substrate 50. In FIG. 5(b) also, an electrode 60 is formed on a part of the main surface 50a. FIGS. 5(a) and 5(b) show the same section. The material constituting the electrode 60 is the same as those for the first detection electrodes 3a and the second detection electrodes 3b. The electrode 60 is formed on the main surface 50a of the glass substrate 50 by sputtering.

FIG. 5(b) shows that potassium ions are concentrated in a portion C1 in the compression stress layer 51 located directly bellow the electrode 60. In this embodiment, it was found that extensive concentration of potassium ions was observed in a region of the compression stress layer 51 from the main surface 50a down to a depth of 3 μm. In other words, because potassium ions are highly concentrated in the portion C1, cracks may readily occur in the glass substrate 50, starting from the boundary between the portion C1 and a portion C2 in the compression stress layer 51 where the electrode 60 is absent. As a result, the strength of the glass substrate 50 is decreased.

What causes potassium ions to concentrate in the portion C1 in the compression stress layer 51 located directly below the electrode 60, leading to a difference in potassium ion concentration distribution between the portion C1 and the portion C2, is not known in details but may be explained as follows. That is, in forming the electrode 60 by sputtering on the main surface 50a of the glass substrate 50, thermal energy generated by sputtering causes the electrode 60 to react with potassium ions and the potassium ions to migrate toward the electrode 60. In the portion C2 where the electrode 60 is absent, potassium ions in the compression stress layer 51 do not react with the electrode 60. However, in the portion C2, the potassium ions migrate toward the interior of the more stable glass substrate 50 by the thermal energy caused by sputtering. As a result, potassium ions are concentrated in the portion C1 and a difference in potassium ion concentration distribution is generated between the portion C1 and the portion C2. The same applies when the electrode 60 is formed on the main surface 50a of the glass substrate 50 by a vapor deposition method or a CVD method.

Figure 6:
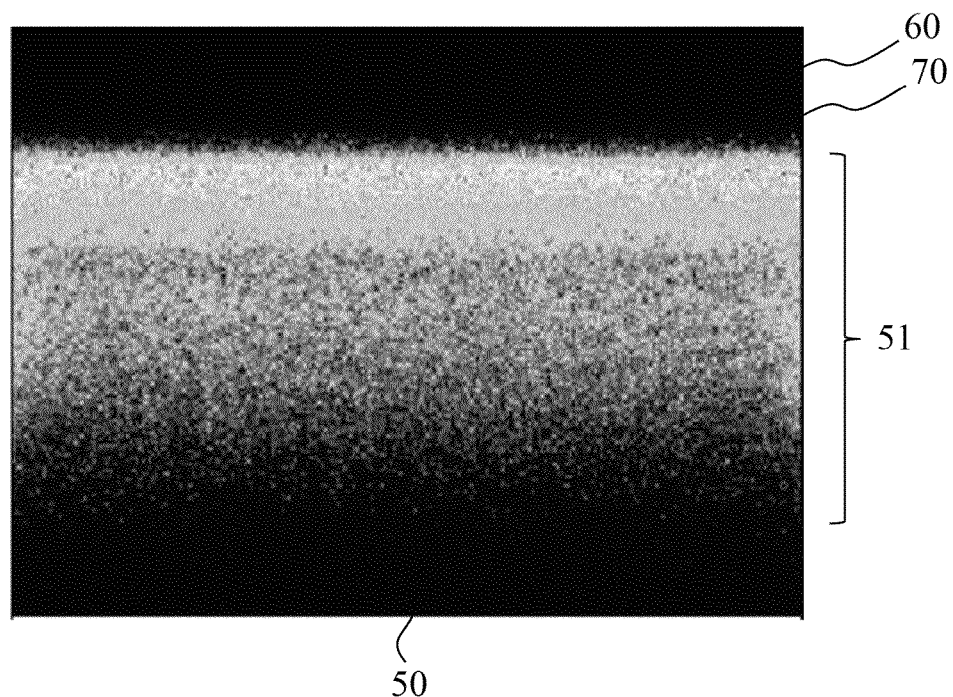
FIG. 6 is a diagram showing a potassium ion concentration distribution observed by electron beam microanalysis on a cross section of a glass substrate.

FIG. 6 shows the potassium ion concentration distribution found by electron beam microanalysis of a cross section of the glass substrate 50. In FIG. 6, an insulating layer 70 is disposed on the main surface 50a of the glass substrate 50 and the electrode 60 is disposed on the insulating layer 70. The material constituting the insulating layer 70 is the same as that of the second insulating layer 6. The insulating layer 70 is formed on the main surface 50a of the glass substrate 50 by a spin coating method. As shown in FIG. 6, potassium ions are evenly distributed in the compression stress layer 51.

In other words, the insulating layer 70 is temporarily formed on the main surface 50a of the glass substrate 50 so that the thermal energy generated by sputtering in forming the electrode 60 on the insulating layer 70 by sputtering is blocked by the insulating layer 70. As a result, the possibility that the potassium ions in the portion C1 would react with the electrode 60 and migrate toward the electrode 60 can be lowered. Moreover, the possibility that the potassium ions in the portion C2 would migrate toward the interior of the glass substrate 50 can be lowered. As such, if the insulating layer 70 is temporarily formed on the main surface 50a of the glass substrate 50 and then the electrode 60 is formed on the insulating layer 70, the possibility that the potassium ions would become concentrated in the portion C1, thereby creating a difference in potassium ion concentration distribution between the portion C1 and the portion C2, can be lowered.

Thus, according to the structure shown in FIG. 6, the possibility of the decrease in strength of the glass substrate 50 can be lowered.

As described above, in this embodiment, the second insulating layer 6 is disposed between the first detection electrodes 3a and the second main surface 2b of the substrate 2 and between the second detection electrodes 4a and the second main surface 2b of the substrate 2. Accordingly, the first detection electrodes 3a and the second detection electrodes 4a are separated from the second main surface 2b of the substrate 2. Moreover, since the second insulating layer 6 is disposed between the first connecting electrodes 3b and the second main surface 2b of the substrate 2, the first connecting electrodes 3b are separated from the second main surface 2b of the substrate 2. Thus, in the input device X1, the possibility of the decrease in strength of the substrate 2 can be lowered.

Figure 7:
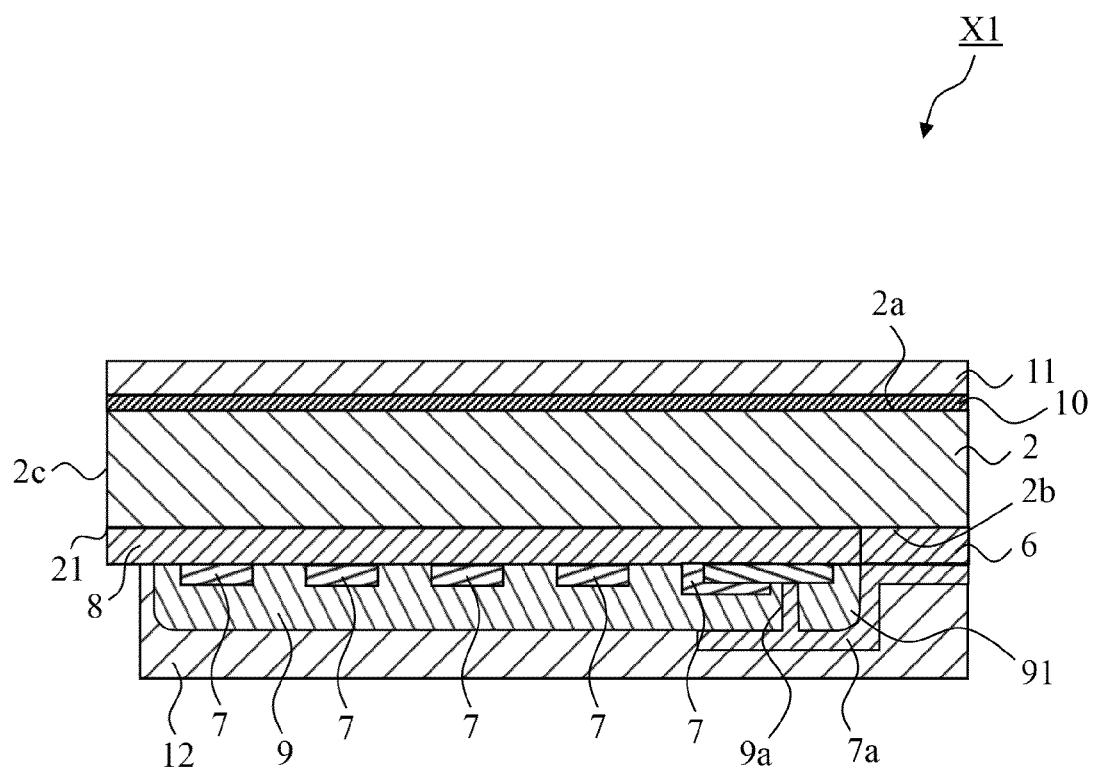
FIG. 7 is a cross-sectional view taken along line III-III in FIG. 1.

As shown in FIG. 7, the detection wires 7, a third insulating layer 8, and a protective layer 9 are disposed on the second main surface 2b of the substrate 2 corresponding to the non-input region E2.

The detection wires 7 detect changes in capacitance generated between the first detection electrodes 3a and the finger F1 and between the second detection electrodes 4a and the finger F1. In this embodiment, as shown in FIG. 1, plural detection wires 7 are disposed in the non-input region E2 located along one of the long sides of the substrate 2 as well as in the non-input region E2 located at one of the short sides of the substrate 2. The detection wires 7 have one ends electrically connected to the first detection electrodes 3a and the second detection electrodes 4a and the other ends located in an outer conduction region G1. A flexible substrate not shown in the drawing is connected to the outer conduction region G1. The flexible substrate is, for example, equipped with a position detection driver not shown in the drawing.

The detection wires 7 are formed of metal thin films, for example. When the detection wires 7 are formed of metal thin films, high hardness and high shape stability are achieved, which is preferable. Examples of the metal thin films include aluminum films, aluminum alloy films, laminate films of chromium films and aluminum films, laminate films of chromium films and aluminum alloy films, silver films, silver alloy films, and gold alloy films. Examples of the method for forming the metal thin films include a sputtering method, a vapor deposition method, and a CVD method.

The third insulating layer 8 is disposed between the detection wires 7 and the second main surface 2b of the substrate 2. As a result, the detection wires 7 are separated from the second main surface 2b of the substrate 2. In this embodiment, the third insulating layer 8 is provided substantially over the entire second main surface 2b of the substrate 2 corresponding to the non-input region E2. Since the third insulating layer 8 is disposed between the detection wires 7 and the second main surface 2b of the substrate 2, the possibility of the decrease in strength of the substrate 2 can be lowered as with the case in which the second insulating layer 6 is disposed between the first detection electrodes 3a and the second main surface 2b of the substrate 2 and between the second detection electrodes 4a and the second main surface 2b of the substrate 2 and the case in which the second insulating layer 6 is disposed between the first connecting electrodes 3b and the second main surface 2b of the substrate 2.

Examples of the material constituting the third insulating layer 8 are the same as those of the first insulating layers 5 and the second insulating layer 6. Examples of the method for forming the third insulating layer 8 are the same as those of the first insulating layers 5 and the second insulating layer 6.

The second insulating layer 6 and the third insulating layer 8 may be formed simultaneously on the second main surface 2b of the substrate 2 in the same step. In such a case, although the second insulating layer 6 is distinguished from the third insulating layer 8 in this embodiment, one insulating layer is actually formed on the second main surface 2b of the substrate 2 corresponding to the input region E1 and the non-input region E2. In such a case, the insulating layer located between the first detection electrodes 3a and the second main surface 2b of the substrate 2, between the second detection electrodes 4a and the second main surface 2b of the substrate 2, and between the first connecting electrodes 3b and the second main surface 2b of the substrate 2 is the second insulating layer 6, and the insulating layer located between the detection wires 7 and the second main surface 2b of the substrate 2 is the third insulating layer 8. Alternatively, the second insulating layer 6 and the third insulating layer 8 may be separately formed by separate steps on the second main surface 2b of the substrate 2.

Figure 8:
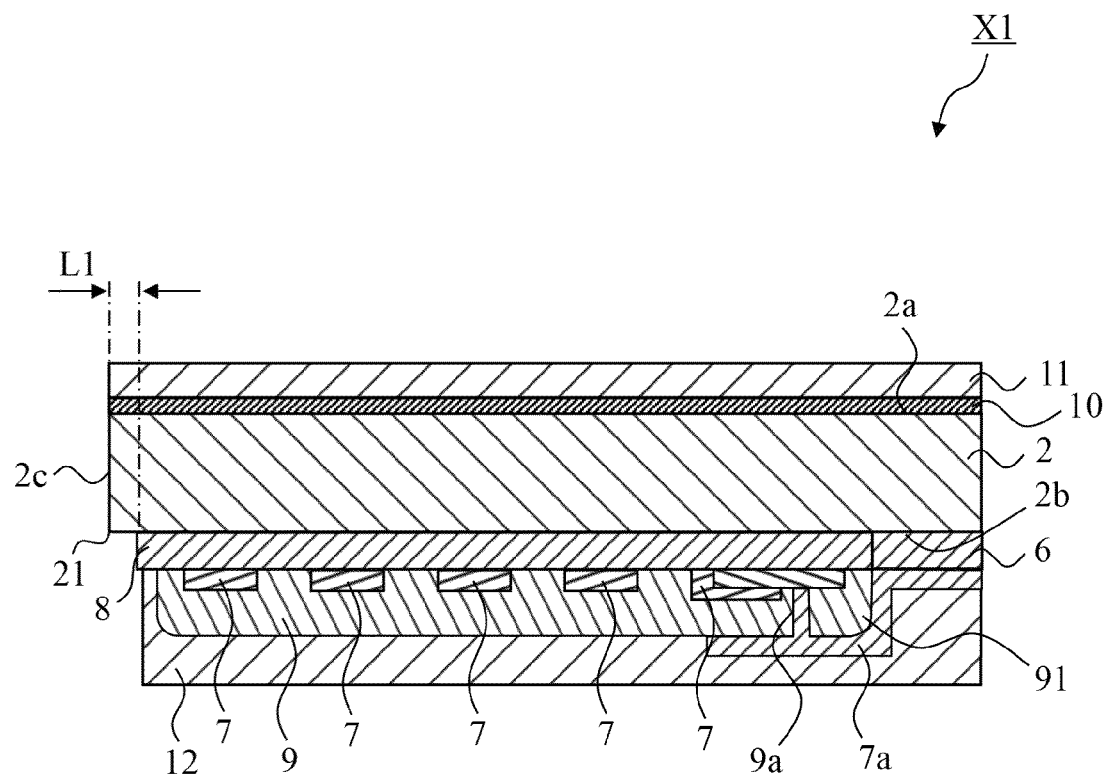
FIG. 8 is a cross-sectional view showing another example of the above-described input device and shows the same portion as in FIG. 7.

As shown in FIG. 8, the third insulating layer 8 is preferably separated from an edge 21 at the end surface 2c of the substrate 2 and on the second main surface 2b side. In the example shown in FIG. 8, the third insulating layer 8 is distant from the edge 21 at the end surface 2c of the substrate 2 by a particular distance L1. In this embodiment, L1 is in the range of 0.85 to 1.15 mm. When the third insulating layer 8 is separated from the edge 21 at the end surface 2c of the substrate 2, the possibility of detachment of the third insulating layer 8 from the second main surface 2b of the substrate 2 can be lowered.

As shown in FIG. 7, in the case where the third insulating layer 8 is provided up to the edge 21 at the end surface 2c of the substrate 2, there is a possibility that the third insulating layer 8 would detach from the second main surface 2b of the substrate 2 starting from the third insulating layer 8 at the edge 21. To be more specific, if the substrate 2 is repeatedly pressed by a user, stress acts on the third insulating layer 8 at the edge 21 of the end surface 2c of the substrate 2, and the third insulating layer 8 at the edge 21 of the end surface 2c of the substrate 2 possibly becomes the starting point from which the third insulating layer 8 detaches from the second main surface 2b of the substrate 2. Moreover, in the process of producing the input device X1, for example, when the end surface 2c of the substrate 2 is physically or chemically polished, there is a possibility that the third insulating layer 8 would detach from the second main surface 2b of the substrate 2 by polishing.

In contrast, according to an example shown in FIG. 8 in which the third insulating layer 8 is separated from the edge 21 at the end surface 2c of the substrate 2, the possibility of occurrence of the aforementioned problem can be lowered. Accordingly, compared to the example shown in FIG. 7, the example shown in FIG. 8 can lower the possibility of detachment of the third insulating layer 8 from the second main surface 2b of the substrate 2.

The protective layer 9 protects the detection wires 7. An example of protection provided to the detection wires 7 is protection of the detection wires 7 from the corrosion caused by absorption of moisture. The protective layer 9 covers the detection wires 7. Examples of the material constituting the protective layer 9 include transparent resins such as acrylic resins, epoxy resins, silicone resins, and urethane resins. Examples of the method for forming the protective layer 9 include a transfer printing method, a spin coating method, and a slit coating method.

A third connecting electrode 7a electrically connects the first detection electrode 3a and the second detection electrode 4a to the detection wires 7. The third connecting electrode 7a has one end electrically connected to the first detection electrode 3a and the second detection electrode 4a and the other end electrically connected to the detection wire 7 through a through hole 9a formed in the protective layer 9 and extending from the upper surface of the protective layer 9. Examples of the material constituting the third connecting electrode 7a are the same as those of the first connecting electrodes 3b and the second connecting electrodes 4b. Examples of the method for forming the third connecting electrode 7a are the same as those for the first connecting electrodes 3b and the second connecting electrodes 4b.

As shown in FIG. 7, the protective layer 9 preferably has a curved inner edge 91 on the input region E1 side. When the inner edge 91 is curved, the possibility of detachment of the third connecting electrode 7a located on the inner edge 91 can be lowered. Moreover, when the inner edge 91 is curved, the stress acting on the protective layer 9 upon user's input operation can be relaxed at the inner edge 91.

As shown in FIGS. 2, 3, and 7, the protective sheet 11 is disposed on the first main surface 2a of the substrate 2 corresponding to the input region E1 and the non-input region E2 with an adhesive layer 10 therebetween.

The protective sheet 11 protects the first main surface 2a of the substrate 2 from being scratched by the user's finger F1. The protective sheet 11 is formed on the entire first main surface 2a of the substrate 2 with the adhesive layer 10 therebetween. The protective sheet 11 may be formed only on the first main surface 2a of the substrate 2 corresponding to the input region E1. Examples of the material constituting the protective sheet 11 include glass, plastic, and polyethylene terephthalate films. Examples of the material constituting the adhesive layer 10 include acrylic resins, urethane resins, epoxy resins, silicone resins, phenolic resins, and polyamide resins.

A color layer may be provided in the protective sheet 11 corresponding to the non-input region E2. According to this structure, the non-input region E2 of the input device X1 can be decorated.

If there is no need to prevent scratching of the first main surface 2a of the substrate 2 by the user's finger F1, the protective sheet 11 does not have to be provided on the first main surface 2a of the substrate 2.

As shown in FIGS. 2, 3, and 7, a protective member 12 is provided on the second main surface 2b of the substrate 2 corresponding to the input region E1 and the non-input region E2.

The protective member 12 protects the first detection electrodes 3a, the first connecting electrodes 3b, the second detection electrodes 4a, the second connecting electrodes 4b, and the third connecting electrode 7a. Examples of the protection provided to the first detection electrodes 3a, the first connecting electrodes 3b, the second detection electrodes 4a, the second connecting electrodes 4b, and the third connecting electrode 7a include protection from the corrosion caused by absorption of moisture and a role of lowering the possibility of malfunction of the input device X1 by entrance of static electricity. Examples of the material constituting the protective member 12 include silicon dioxide and silicon nitride. Examples of the method for forming the protective member 12 include a sputtering method, an ion plating method, a screen printing method, and an ink jet printing method.

Next, the principle of detection in the input device X1 is described.

A position detection driver is electrically connected to the detection wires 7 located in the outer conduction region G1. The position detection driver includes a power supply unit. The power supply unit of the position detection driver provides a voltage to the first detection electrodes 3a and the second detection electrodes 4a. When the finger F1, which is a conductor, approaches the first main surface 2a of the substrate 2 corresponding to the input region E1 with the protective sheet 11 therebetween, a capacitance is generated between the finger F1 and the first detection electrode 3a and between the finger F1 and the second detection electrode 4a. The position detection driver constantly detects the capacitance generated at the first detection electrodes 3a and the second detection electrodes 4a. The position detection driver detects the input position where the user performed the input operation on the basis of the combination of the first detection electrode 3a and the second detection electrode 4a at which a capacitance of a particular value or higher is detected. As such, the input device X1 can detect the input position.

As described above, the input device X1 can lower the possibility of the decrease in strength of the substrate 2.

Figure 9:
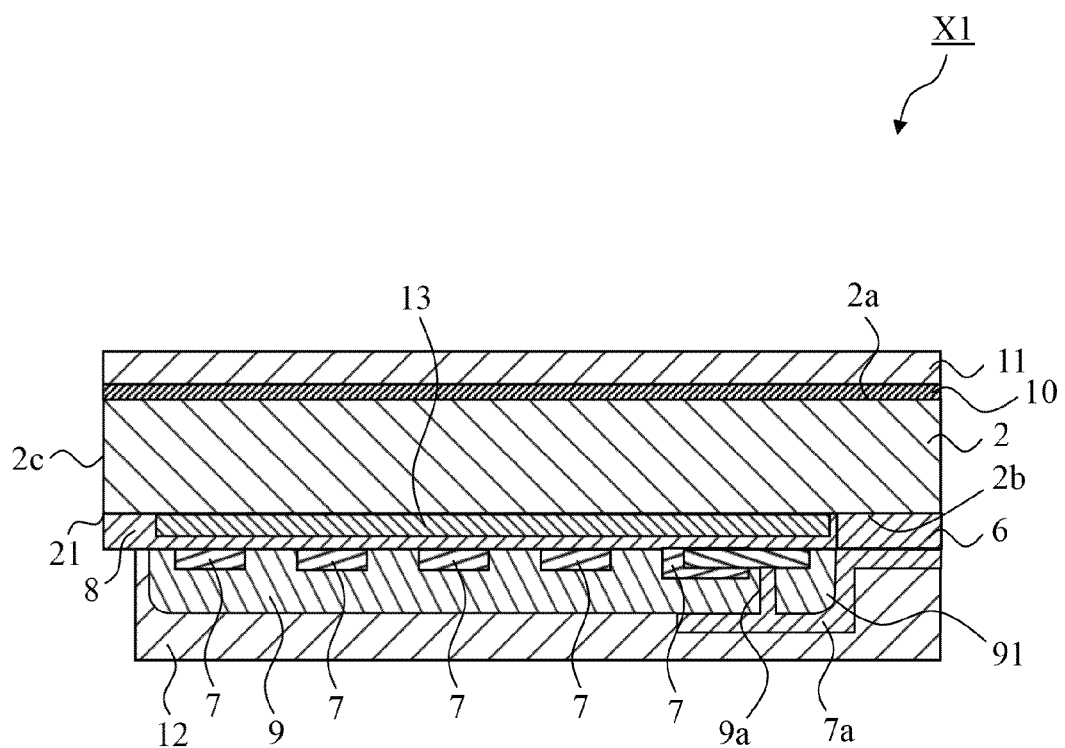
FIG. 9 is a cross-sectional view showing yet another example of the above-described input device and shows the same portion as in FIG. 7.

As shown in FIG. 9, a light-shielding layer 13 may be provided between the third insulating layer 8 and the second main surface 2b of the substrate 2. In particular, the light-shielding layer 13 is disposed on the second main surface 2b of the substrate 2 and the third insulating layer 8 is disposed on the second main surface 2b of the substrate 2 and covers the light-shielding layer 13. In this embodiment, the light-shielding layer 13 has a frame shape surrounding the input region E1 and is disposed on the second main surface 2b of the substrate 2 corresponding to the non-input region E2.

The light-shielding layer 13 has a light-shielding property. In this specification, the "light-shielding property" is a property to shield some or all components of visible light by reflection or absorption. Examples of the material constituting the light-shielding layer 13 are resin materials containing coloring materials. Examples of the resin material include transparent resins such as acrylic resins, epoxy resins, silicone resins, and urethane resins. Examples of the coloring material include carbon, titanium, and chromium. The color of the light-shielding layer 13 is not limited to black and may be any other color. Examples of the method for forming the light-shielding layer 13 include a screen printing method, a sputtering method, a CVD method, and a vapor deposition method.

The detection wires 7 are formed on the light-shielding layer 13 with the third insulating layer 8 therebetween. Since the detection wires 7 are formed on the light-shielding layer 13 with the third insulating layer 8 therebetween, the possibility that the detection wire 7 would become recognizable by the user can be lowered.

In order to decrease the possibility that the detection wires 7 would become recognizable by the user, preferably all of the detection wires 7 are disposed on the light-shielding layer 13 with the third insulating layer 8 therebetween. However, it is not necessary that all detection wires 7 be disposed on the light-shielding layer 13 with the third insulating layer 8 therebetween. In other words, it would suffice if at least some of the detection wires 7 are disposed on the light-shielding layer 13 with the third insulating layer 8 therebetween.

Figure 10:
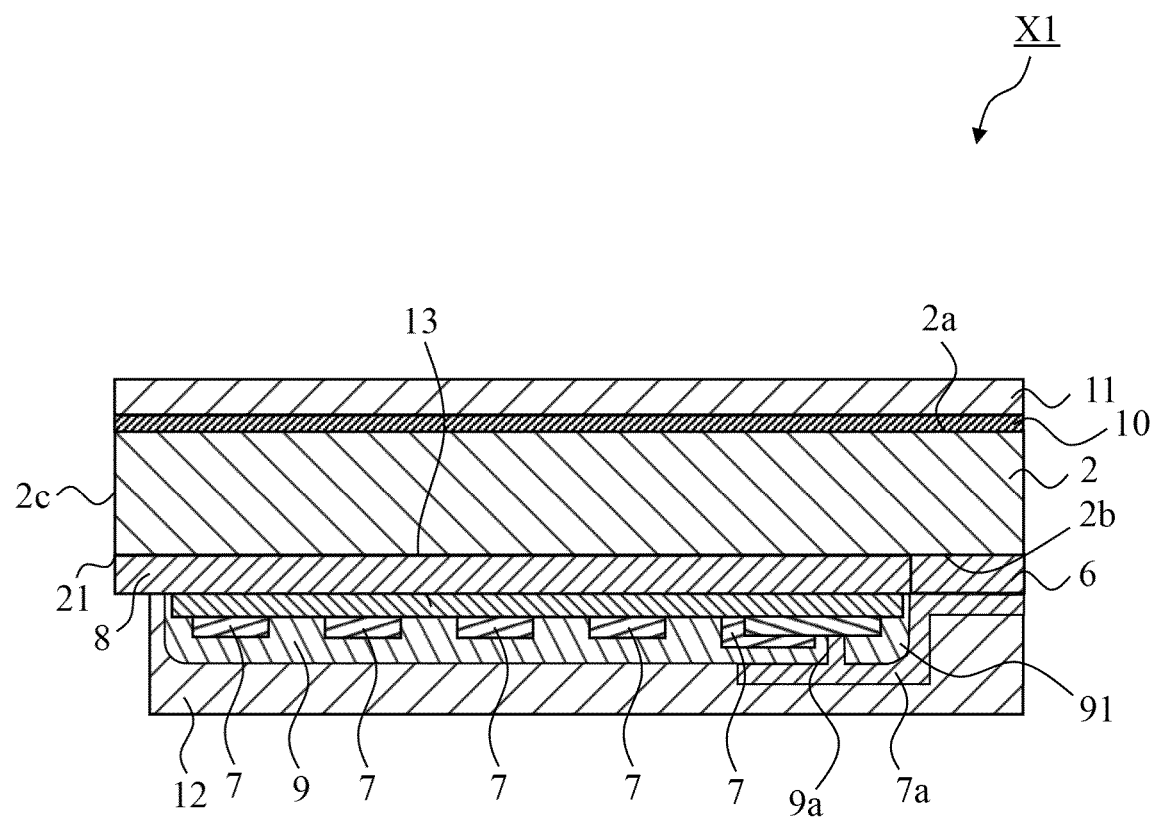
FIG. 10 is a cross-sectional view showing still another example of the above-described input device and shows the same portion as in FIG. 7.

Alternatively, as shown in FIG. 10, the light-shielding layer 13 may be disposed on the third insulating layer 8. In this case, the detection wires 7 are disposed on the light-shielding layer 13. Since the detection wires 7 are disposed on the light-shielding layer 13, the possibility that the detection wires 7 would become recognizable by the user can be lowered.

Next, a display device Y1 that includes the input device X1 is described with reference to FIG. 11.

Figure 11:
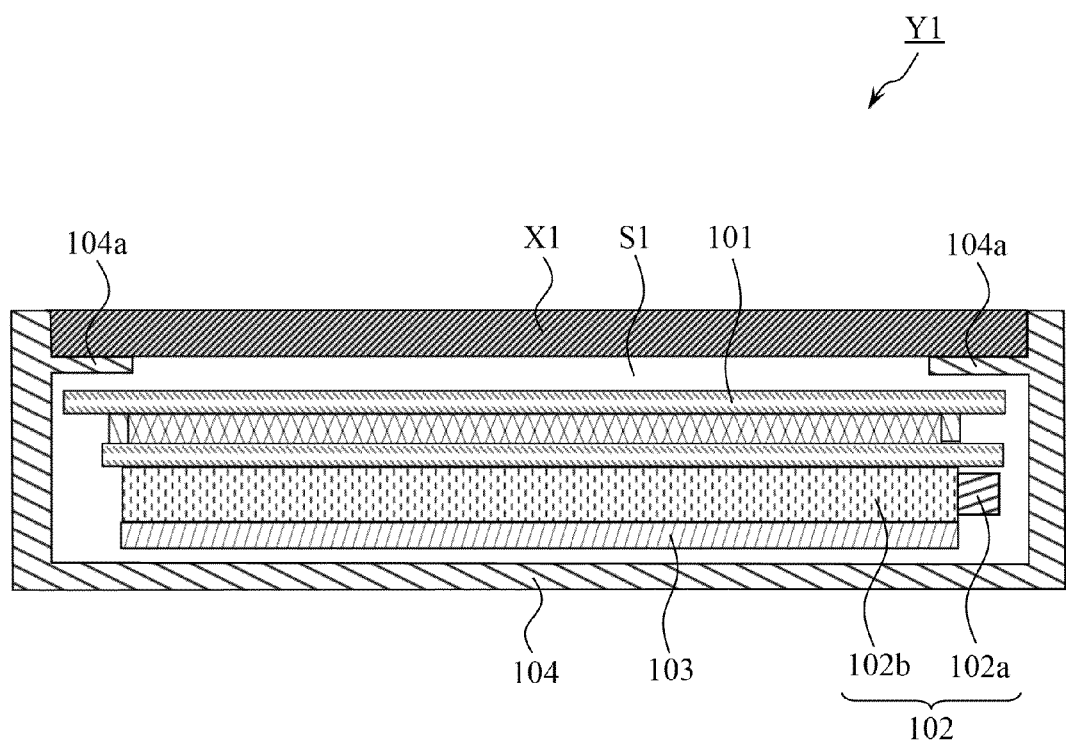
FIG. 11 is a cross-sectional view showing a schematic structure of a display device according to the first embodiment of the present invention.

As shown in FIG. 11, the display device Y1 according to this embodiment includes the input device X1, a liquid crystal panel 101, a backlight 102, a circuit board 103, and a first casing 104.

The liquid crystal panel 101 is a display panel that uses a liquid crystal composition for display. The liquid crystal panel 101 is arranged to oppose the input device X1 with a space S1 therebetween. A display panel such as a plasma panel, an organic EL panel, or an electronic paper may be used instead of the liquid crystal panel 101. The organic EL panel is a display panel that uses a substance that emits light upon application of voltage. In particular, in an organic EL panel, an illuminant that contains an organic substance such as a diamine is vapor-deposited on a substrate and display is performed by applying a direct voltage of 5 to 10 V. If an organic EL panel is used instead of the liquid crystal panel 101, the backlight 102 is no longer necessary.

The backlight 102 includes a light source 102a and a light guiding panel 102b. The light source 102a emits light toward the light guiding panel 102b. The backlight 102 is constituted by, for example, LEDs (light-emitting diodes). A cold cathode fluorescent lamp, a halogen lamp, a xenon lamp, or EL (electro-luminescence) may be used instead of LEDs. The light guiding panel 102b substantially evenly guides light from the light source 102a over the entire lower surface of the liquid crystal panel 101.

The circuit board 103 is a plate-shape or a film-shape board in which parts such as ICs (integrated circuits), resistors, and capacitors are mounted on a surface and connected to one another with wires so as to constitute an electronic circuit. The circuit board 103 is disposed on the rear side of the backlight 102. The circuit board 103 includes a connector. A flexible substrate connected to the outer conduction region G1 is inserted into the connector.

The first casing 104 houses the liquid crystal panel 101, the backlight 102, and the circuit board 103. Examples of the material constituting the first casing 104 include resins such as polycarbonate or metals such as stainless steel and aluminum.

The first casing 104 includes a supporting member 104a. The supporting member 104a supports the input device X1. In particular, the supporting member 104a supports the non-input region E2 by surrounding the input region E1. The input device X1 is bonded to the supporting member 104a with an adhesive member such as a double-sided adhesive tape or the like.

As such, various types of data can be input to the input device X1 by performing input operation in the input region E1 while watching the liquid crystal panel 101. Note that the input device X1 may be provided with a function of causing various sensations, such as pressing sensations, tracing sensations, and feel sensations, to the user inputting the data in inputting various types of data. In such a case, the substrate 2 of the input device X1 includes one or more piezoelectric elements so that when a particular input operation or a particular pressing load is detected, the piezoelectric elements can be vibrated at a particular frequency.

Since the display device Y1 includes the input device X1, the possibility of the decrease in strength of the substrate 2 can be lowered.

Although the example described above is an example in which the input device X1 opposes the liquid crystal panel 101 with the space S1 therebetween, the example is not limiting. The input device X1 may be arranged to oppose the liquid crystal panel 101 without the space S1 therebetween. In other words, the input device X1 may be arranged to oppose and make contact with the liquid crystal panel 101.

Next, a portable terminal P1 including the display device Y1 is described with reference to FIG. 12.

Figure 12:
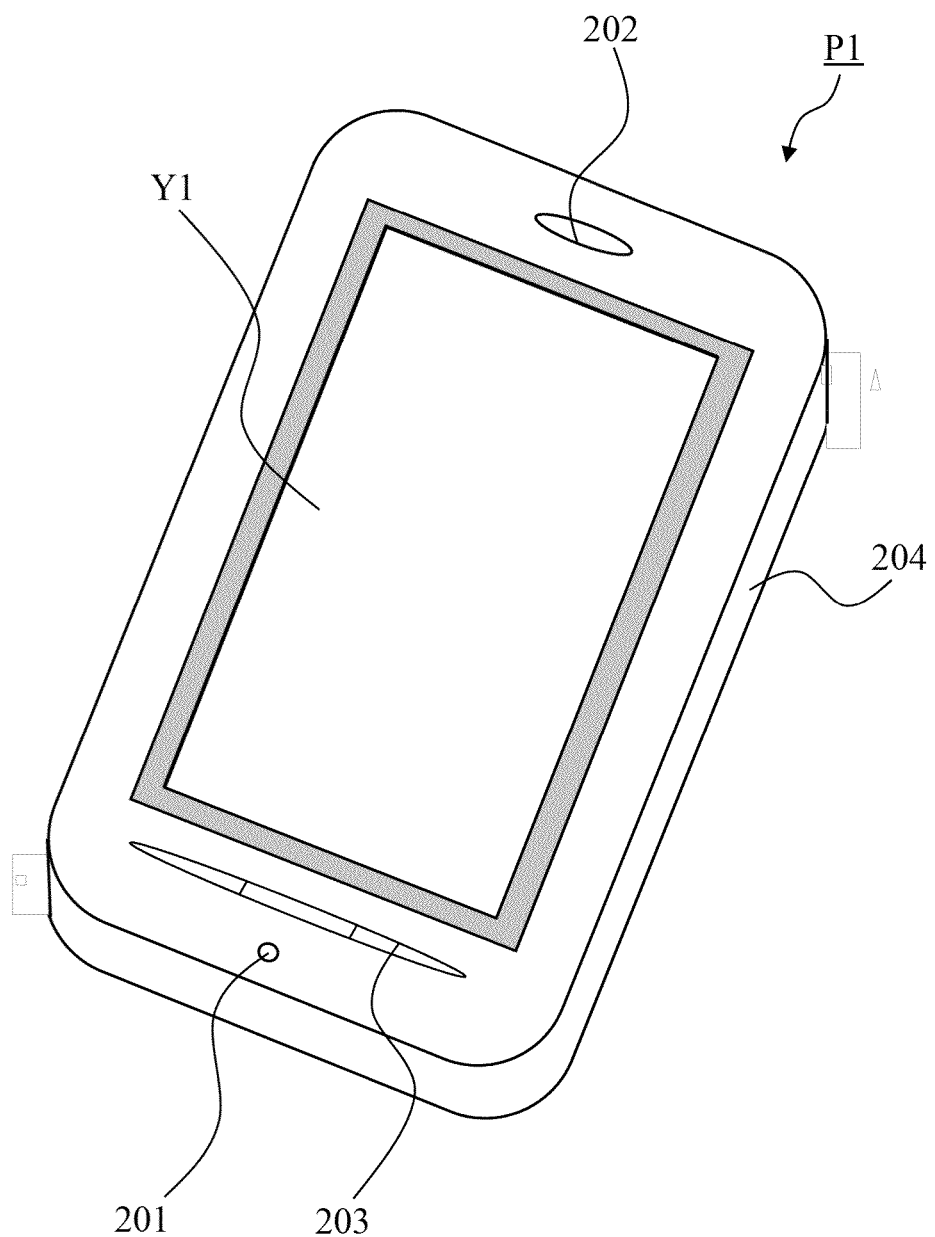
FIG. 12 is a perspective view showing a schematic structure of a portable terminal according to the first embodiment of the present invention.

As shown in FIG. 12, the portable terminal P1 of this embodiment is an electronic apparatus such as a cellular phone, a smart phone, a PDA (personal digital assistant), or the like. The portable terminal P1 includes the display device Y1, a sound input unit 201, a sound output unit 202, a key input unit 203, and a second casing 204.

The sound input unit 201 is constituted by a microphone, for example, and voice or the like of the user is input to the sound input unit 201. The sound output unit 202 is constituted by a speaker or the like and voice or the like from person at the other end is output from the sound output unit 202. The key input unit 203 is constituted by, for example, mechanical keys. The key input unit 203 may be operation keys displayed in the display screen. The second casing 204 houses the display device Y1, the sound input unit 201, the sound output unit 202, and the key input unit 203.

The portable terminal P1 may additionally include a digital camera unit, a one-segment broadcasting tuner, a near field communication unit such as an infrared transmission functional unit, and various types of interfaces depending on the required functions. However, detail illustrations and descriptions of these units are omitted.

Since the portable terminal P1 includes the display device Y1, the possibility of the decrease in strength of the substrate 2 can be lowered.

Note that although an example of the portable terminal P1 that includes the sound input unit 201 is described above, this example is not limiting. That is, the portable terminal P1 need not include the sound input unit 201.

Moreover, although an example of the portable terminal P1 that includes the second casing 204 housing the display device Y1, the sound input unit 201, the sound output unit 202, and the key input unit 203 is described above, this example is not limiting. The second casing 204 need not be separately provided and the first casing 104 of the display device Y1 may serve as the casing of the portable terminal P1.

The display device Y1 may be installed in various types of electronic appliances such as an industrial programmable display device, a vehicle-mounted display device, an electronic organizer, a personal computer, a copy machine, a terminal machine for gaming, a television, and a digital camera, instead of the portable terminal P1.

Second Embodiment

Figure 13:
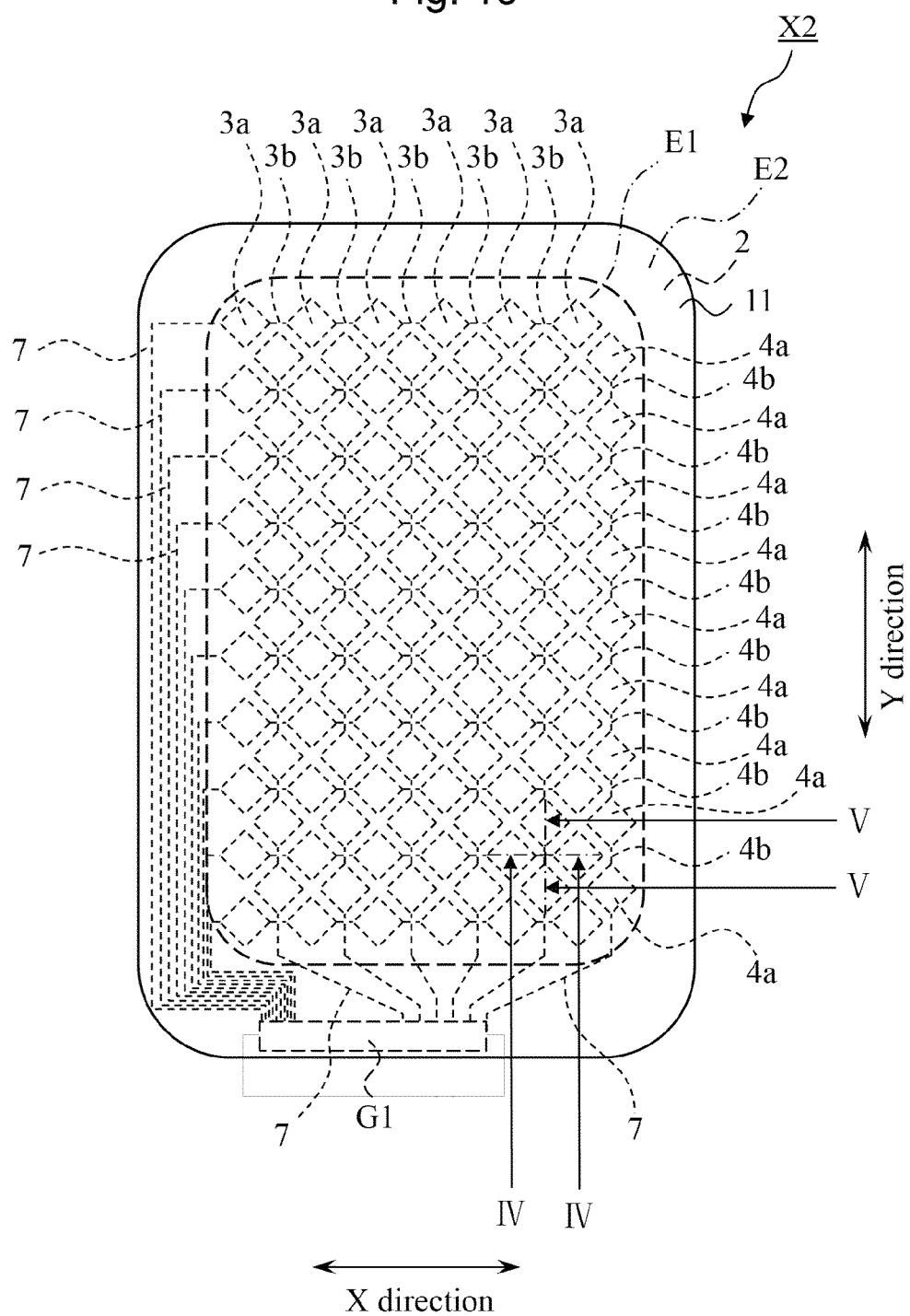
FIG. 13 is a plan view showing a schematic structure of an input device according to a second embodiment of the present invention.
Figure 14:
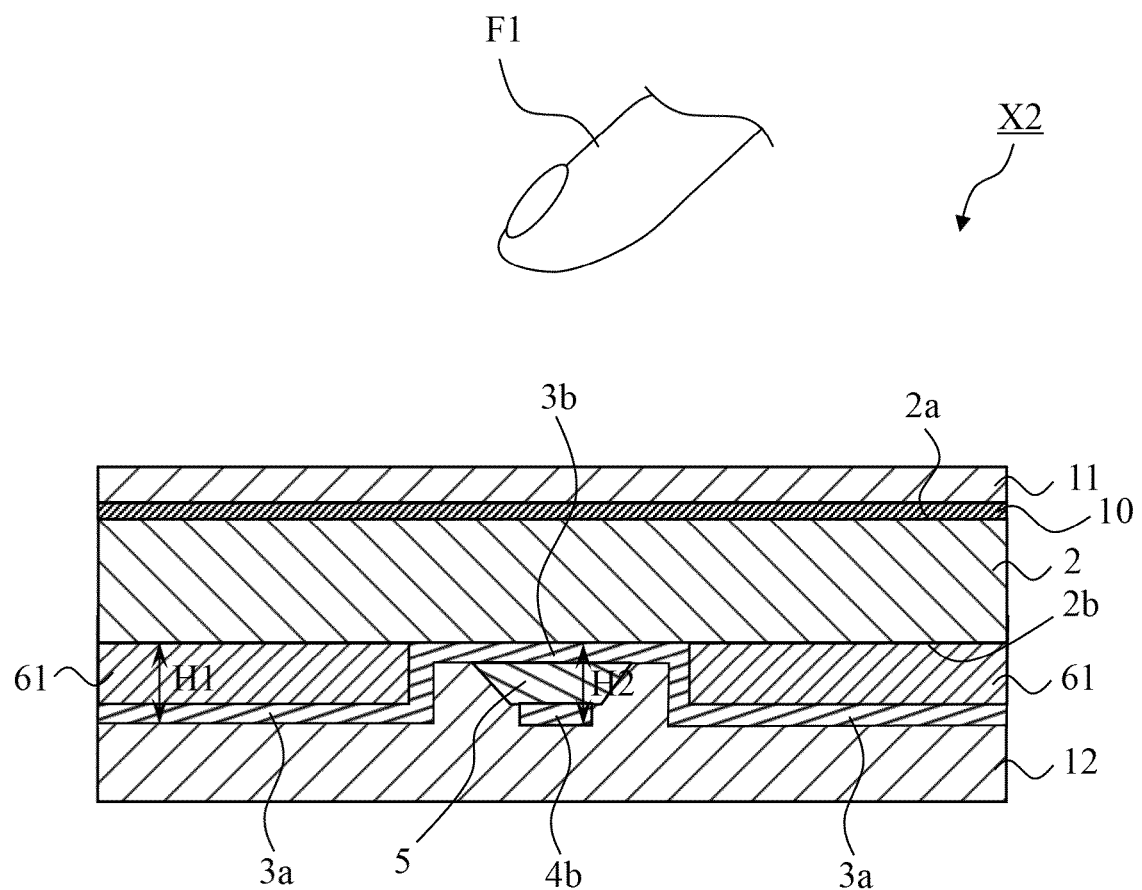
FIG. 14 is a cross-sectional view taken along line IV-IV in FIG. 13.
Figure 15:
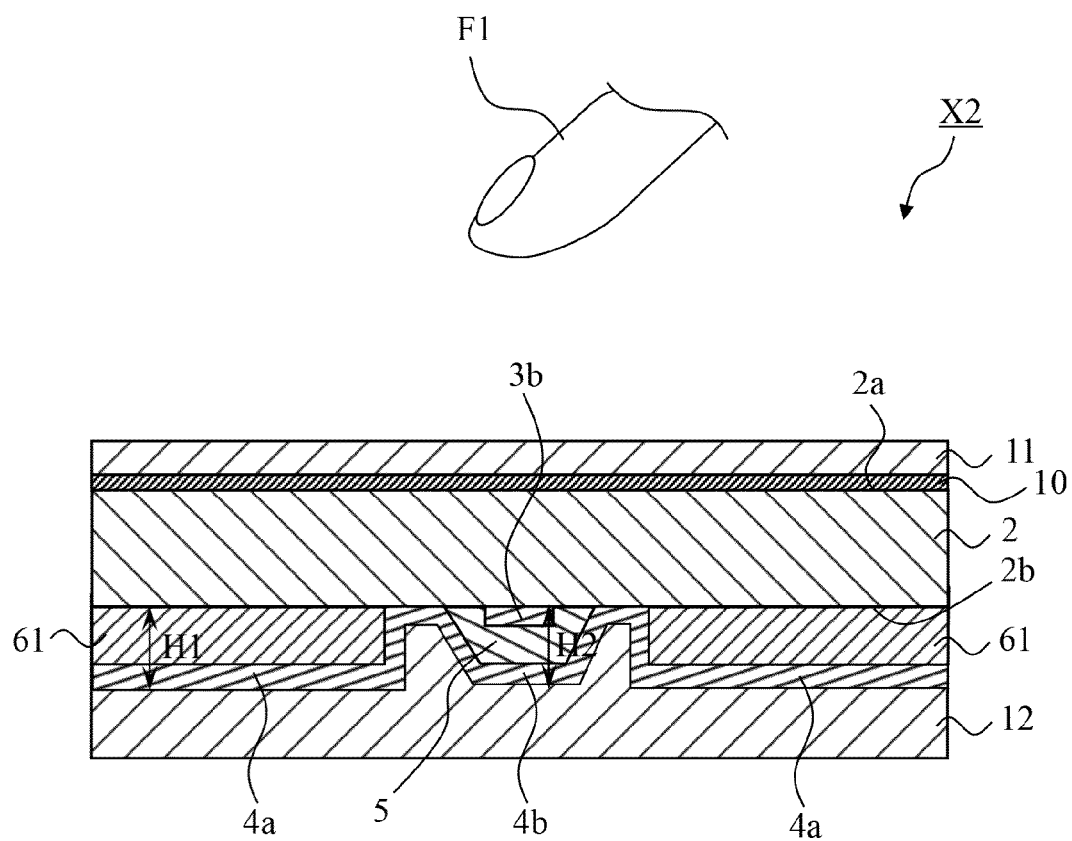
FIG. 15 is a cross-sectional view taken along line V-V in FIG. 13.

FIG. 13 is a plan view showing a schematic structure of an input device X2 according to this embodiment. FIG. 14 is a cross-sectional view taken along line IV-IV in FIG. 13. FIG. 15 is a cross-sectional view taken along line V-V in FIG. 13. In FIGS. 13 to 15, the structures having the same functions as those in FIGS. 1 to 3 are represented by the same reference signs and the detail descriptions thereof are omitted.

As shown in FIGS. 14 and 15, the input device X2 includes a second insulating layer 61 instead of the second insulating layer 6 in the first embodiment.

The second insulating layer 61 is formed between the first detection electrodes 3a and the second main surface 2b of the substrate 2 and between the second detection electrodes 4a and the second main surface 2b of the substrate 2. As a result, the first detection electrodes 3a and the second detection electrodes 4a become separated from the second main surface 2b of the substrate 2. In this embodiment, the second insulating layer 61 is not disposed between the first connecting electrodes 3b and the second main surface 2b of the substrate 2. In other words, the first connecting electrodes 3b are disposed on the second main surface 2b of the substrate 2 without the second insulating layer 61 therebetween.

In this input device X2, the second insulating layer 61 is disposed between the first detection electrodes 3a and the second main surface 2b of the substrate 2 and between the second detection electrodes 4a and the second main surface 2b of the substrate 2 but not between the first connecting electrodes 3b and the second main surface 2b of the substrate 2. Thus, although the input device X2 can lower the possibility of the decrease in strength of the substrate 2 compared to conventional input devices, there is still a possibility of the decrease in strength of the substrate 2 at the portion corresponding to the first connecting electrodes 3b compared to the input device X1.

However, in the input device X2, the second insulating layer 61 is disposed between the first detection electrodes 3a and the second main surface 2b of the substrate 2 and between the second detection electrodes 4a and the second main surface 2b of the substrate 2, but not between the first connecting electrodes 3b and the second main surface 2b of the substrate 2. Accordingly, the height position of the first detection electrodes 3a and the second detection electrodes 4a with respect to the second main surface 2b of the substrate 2 approaches the height position of the second connecting electrodes 4b with respect to the second main surface 2b of the substrate 2. Thus, the possibility that the transmittance and reflectance for visible light differ between the portion where the first detection electrodes 3a and the second detection electrodes 4a are formed and the portion where the second connecting electrodes 4b are formed can be lowered. Accordingly, when the input device X2 is installed in a display device, the display quality of the display device is improved.

The height position of the first detection electrodes 3a and the second detection electrodes 4a with respect to the second main surface 2b of the substrate 2 and the height position of the second connecting electrodes 4b with respect to the second main surface 2b of the substrate 2 are preferably substantially the same. In other words, in this embodiment, since the second main surface 2b of the substrate 2 is substantially flat, the height H1 of the first detection electrodes 3a and the second detection electrodes 4a with respect to the second main surface 2b of the substrate 2 is substantially the same as the height H2 of the second connecting electrodes 4b with respect to the second main surface 2b of the substrate 2. According to this structure, the visible-light transmittance and reflectance of the portion where the first detection electrodes 3a and the second detection electrodes 4a are formed becomes substantially the same as those of the portion where the second connecting electrodes 4b are formed. As a result, when the input device X2 is installed in the display device, the display quality of the display device is further improved.

As discussed above, compared to typical input devices, the input device X2 can decrease the possibility of the decrease in strength of the substrate 2. Moreover, when the input device X2 is installed in a display device, the display quality of the display device is improved.

Third Embodiment

Figure 16:
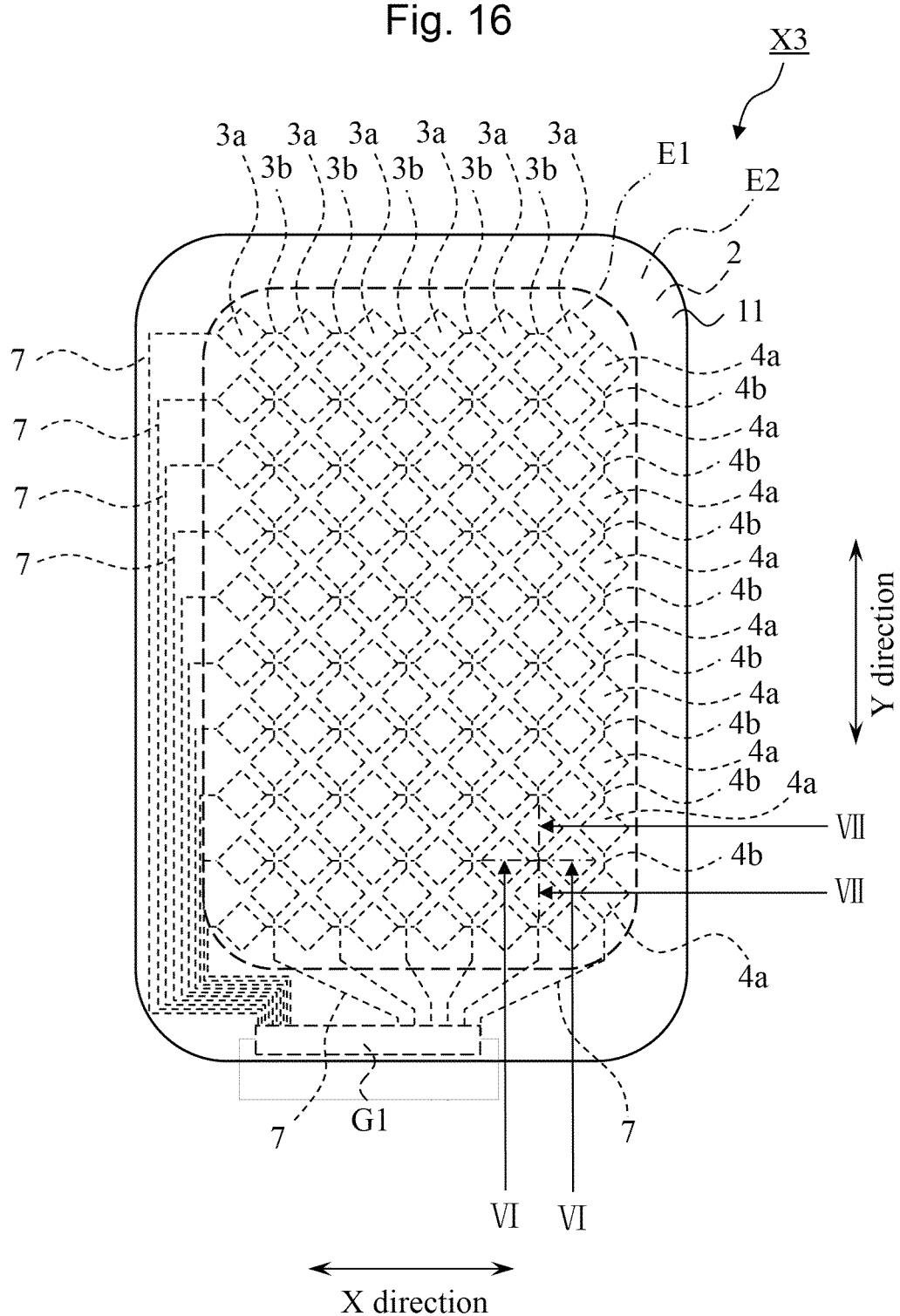
FIG. 16 is a plan view showing a schematic structure of an input device according to a third embodiment of the present invention.
Figure 17:
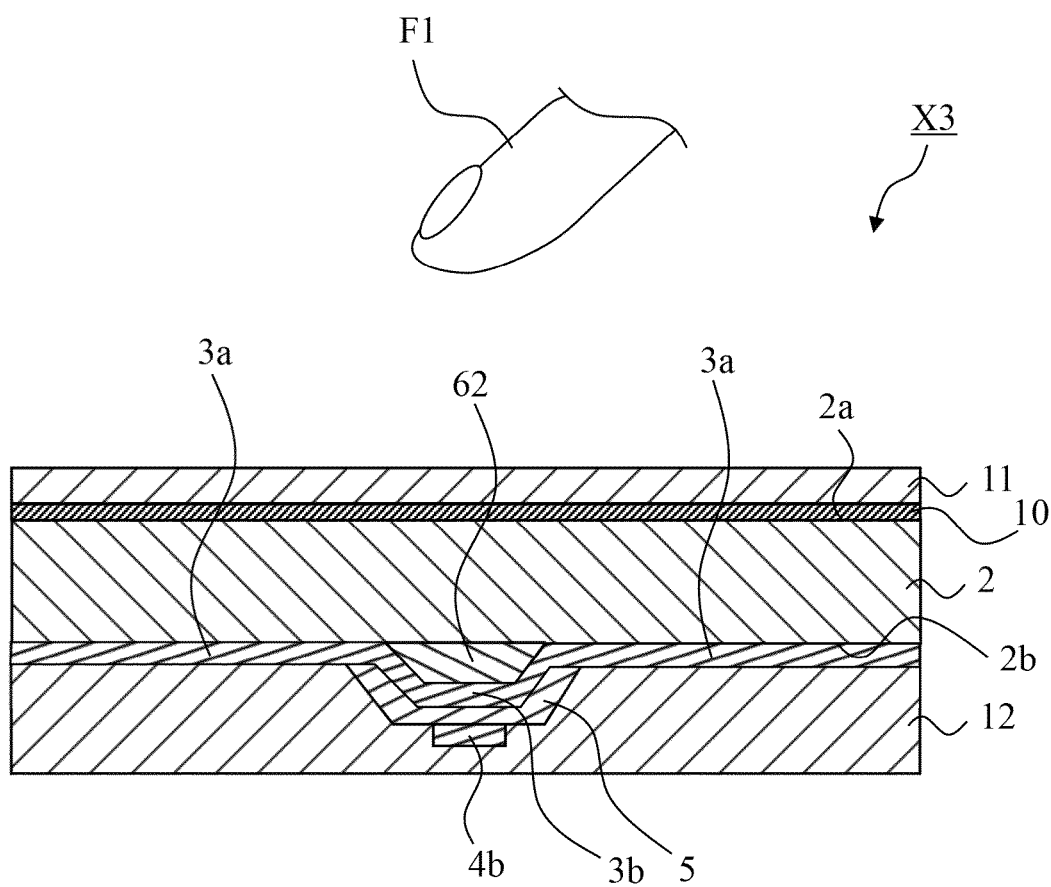
FIG. 17 is a cross-sectional view taken along line VI-VI in FIG. 16.
Figure 18:
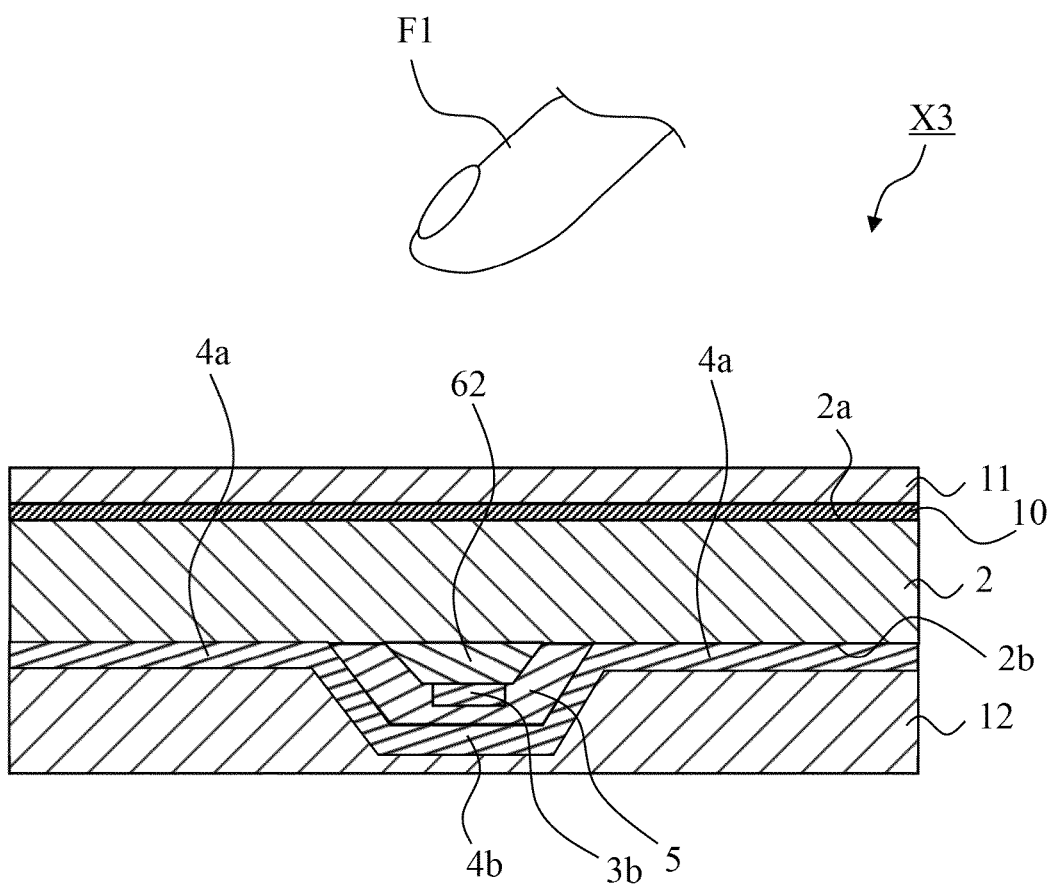
FIG. 18 is a cross-sectional view taken along line VII-VII in FIG. 16.

FIG. 16 is a plan view showing a schematic structure of an input device X3 according to this embodiment. FIG. 17 is a cross-sectional view taken along line VI-VI in FIG. 16. FIG. 18 is a cross-sectional view taken along line VII-VII in FIG. 16. In FIGS. 16 to 18, the structures having the same functions as those in FIGS. 1 to 3 are represented by the same reference signs and the detail descriptions thereof are omitted.

As shown in FIGS. 17 and 18, the input device X3 includes a second insulating layer 62 instead of the second insulating layer 6 in the first embodiment.

The second insulating layer 62 is disposed between the first connecting electrodes 3b and the second main surface 2b of the substrate 2. As a result, the first connecting electrode 3b is separated from the second main surface 2b of the substrate 2. In this embodiment, the second insulating layer 62 is not disposed between the first detection electrodes 3a and the second main surface 2b of the substrate 2 and between the second detection electrodes 4a and the second main surface 2b of the substrate 2. In other words, the first detection electrodes 3a and the second detection electrodes 4a are disposed on the second main surface 2b of the substrate 2 without the second insulating layer 62 therebetween.

As described above, in the input device X3, the second insulating layer 62 is disposed between the first connecting electrodes 3b and the second main surface 2b of the substrate 2 but not between the first detection electrodes 3a and the second main surface 2b of the substrate 2 or between the second detection electrodes 4a and the second main surface 2b of the substrate 2. Accordingly, compared to typical input devices, the input device X3 can lower the possibility of the decrease in strength of the substrate 2; however, compared to the input device X1, there is a possibility of the decrease in strength of the substrate 2 in the portion corresponding to the first detection electrodes 3a and the second detection electrodes 4a.

However, in the input device X3, the second insulating layer 62 is not disposed between the first detection electrodes 3a and the second main surface 2b of the substrate 2 or between the second detection electrodes 4a and the second main surface 2b of the substrate 2. Accordingly, when the input device X3 is installed in a display device, the display quality of the display device is improved.

In other words, the second insulating layer 62 is yellowish in color depending on the constitutional material. Thus, forming the second insulating layer 62 between the first detection electrodes 3a and the second main surface 2b of the substrate 2 and between the second detection electrodes 4a and the second main surface 2b of the substrate 2 decreases the visibility of the input device X3 although the possibility of the decrease in strength of the substrate 2 can be lowered. In other words, since the area of the first detection electrodes 3a and the second detection electrodes 4a in a plan view is significantly larger than the area of the first connecting electrodes 3b in a plan view, the transmittance of the input device X3 is decreased by forming the second insulating layer 62 between the first detection electrodes 3a and the second main surface 2b of the substrate 2 and between the second detection electrodes 4a and the second main surface 2b of the substrate 2.

Thus, in the input device X3, the second insulating layer 62 is disposed between the first connecting electrodes 3b and the second main surface 2b of the substrate 2 but not between the first detection electrodes 3a and the second main surface 2b of the substrate 2 or between the second detection electrodes 4a and the second main surface 2b of the substrate 2. Accordingly, when the input device X3 is installed in the display device Y1, the display quality of the display device Y1 is improved.

As described above, compared to typical input devices, the input device X3 can lower the possibility of the decrease in strength of the substrate 2. Moreover, when the input device X3 is installed in a display device, the display quality of the display device is improved.

In the input device X3, the second insulating layer 62 is disposed between the first connecting electrodes 3b and the second main surface 2b of the substrate 2 but not between the first detection electrodes 3a and the second main surface 2b of the substrate 2 or between the second detection electrodes 4a and the second main surface 2b of the substrate 2. Accordingly, in the input device X3, the difference between the height position of the first detection electrodes 3a and the second detection electrodes 4a with respect to the second main surface 2b of the substrate 2 and the height position of the second connecting electrodes 4b with respect to the second main surface 2b of the substrate 2 is greater compared to that in the input device X1. In other words, the height position of the second connecting electrodes 4b with respect to the second main surface 2b of the substrate 2 is larger in the input device X3 than in the input device X1 and thus the intersections between the first connecting electrodes 3b and the second connecting electrodes 4b may become identifiable as dots by the user.

Figure 19:
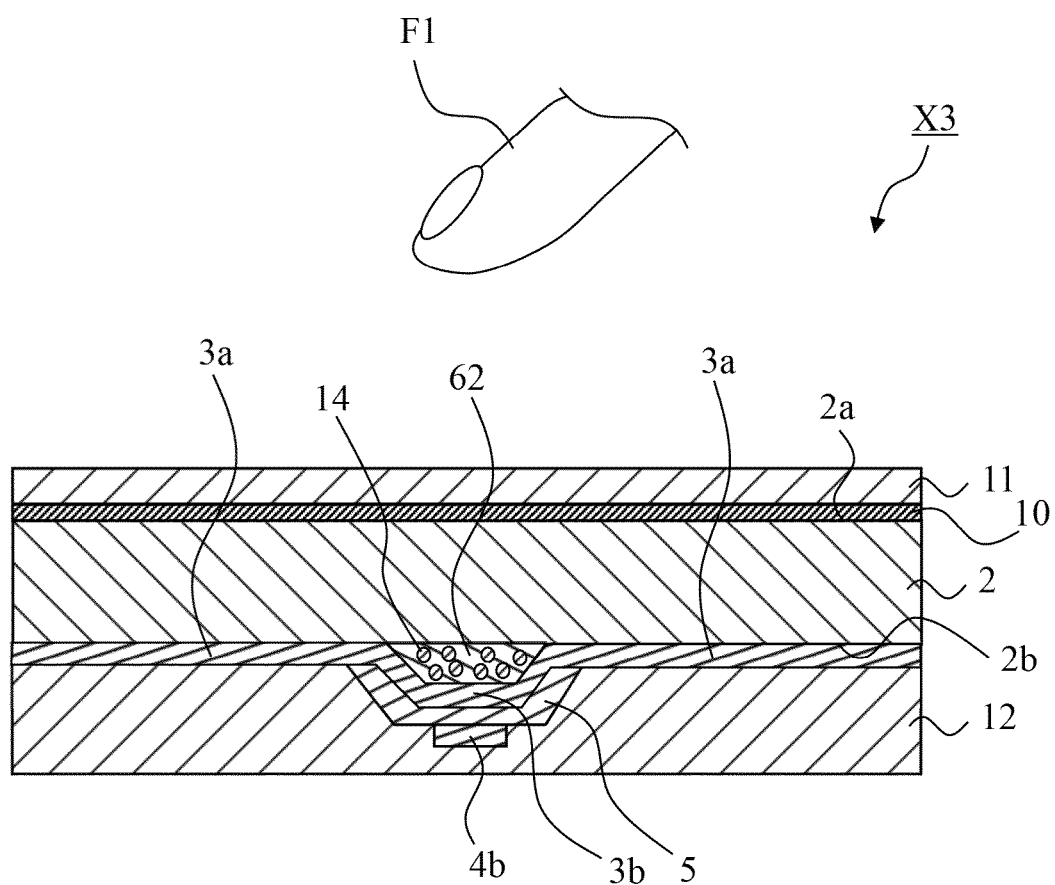
FIG. 19 is a cross-sectional view showing another example of the above-described input device and shows the same portion as in FIG. 17.
Figure 20:
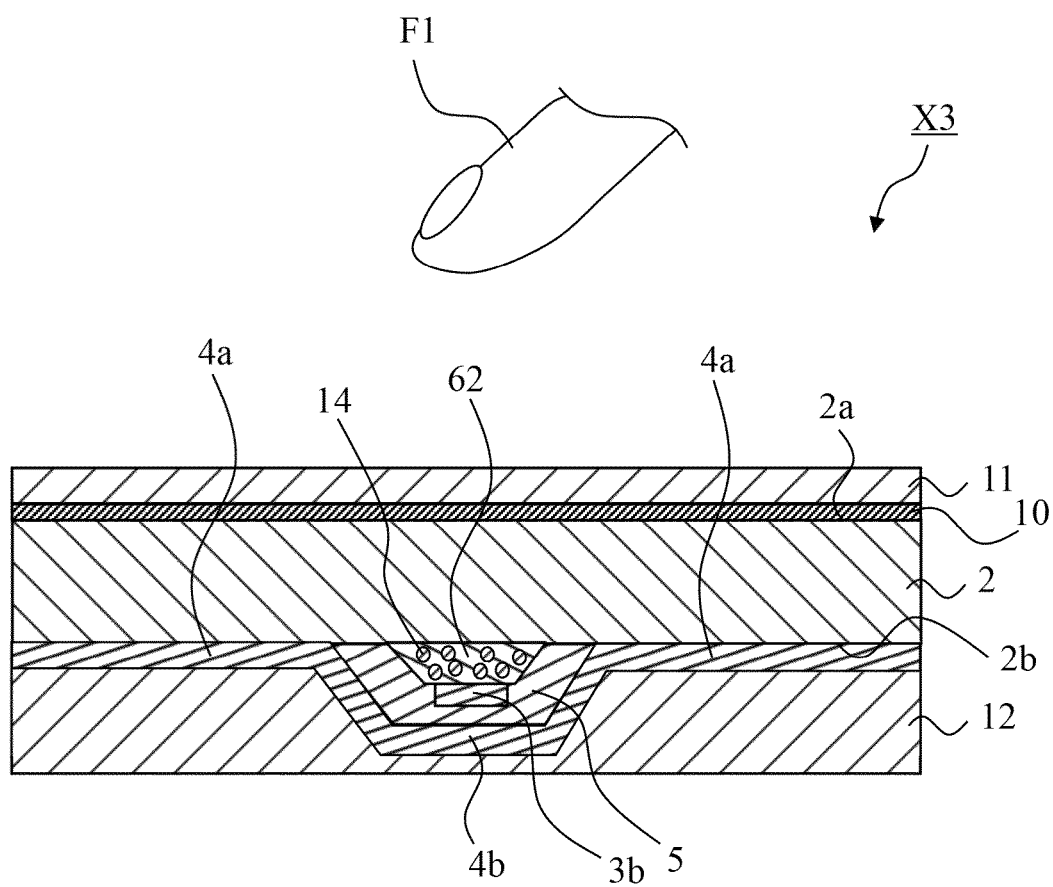
FIG. 20 is a cross-sectional view showing yet another example of the above-described input device and shows the same portion as in FIG. 18.

Accordingly, as shown in FIGS. 19 and 20, the input device X3 preferably includes a light-scattering member 14 in the second insulating layer 62. The light-scattering member 14 scatters light. Examples of the material constituting the light-scattering member 14 include silicon dioxide, aluminum oxide, titanium oxide, yttrium oxide, zirconium dioxide, and hollow silicon dioxide.

The light-scattering member 14 contained in the second insulating layer 62 scatters outside light entering from the outer side of the substrate 2 and inside light entering from the backlight 102. Accordingly, the possibility that the intersections between the first connecting electrodes 3b and the second connecting electrodes 4b would be identified as dots by the user can be lowered.

The light-scattering member 14 may be contained in the first insulating layer 5 instead of the second insulating layer 62. The light-scattering member 14 may be contained in the first insulating layer 5 and the second insulating layer 62.

In the first embodiment, an example in which the second insulating layer 6 is disposed between the second main surface 2b of the substrate 2 and the first detection electrodes 3a, between the second main surface 2b of the substrate 2 and the second detection electrodes 4a, and between the second main surface 2b of the substrate 2 and the first connecting electrodes 3b is described. In the second embodiment, an example in which the second insulating layer 61 is disposed between the second main surface 2b of the substrate 2 and the first detection electrodes 3a and between the second main surface 2b of the substrate 2 and the second detection electrodes 4a is described. In the third embodiment, an example in which the second insulating layer 62 is disposed between the first connecting electrodes 3b and the second main surface 2b of the substrate 2 is described. However, the present invention is not limited to such embodiments.

For example, a second insulating layer may be disposed between the first detection electrodes 3a and the second main surface 2b of the substrate 2 but not between the second detection electrodes 4a and the second main surface 2b of the substrate 2 or between the first connecting electrodes 3b and the second main surface 2b of the substrate 2. Alternatively, for example, a second insulating layer may be disposed between the first detection electrodes 3a and the second main surface 2b of the substrate 2 and between the first connecting electrodes 3b and the second main surface 2b of the substrate 2 but not between the second detection electrodes 4a and the second main surface 2b of the substrate 2. In other words, it is sufficient if a second insulating layer is disposed between the second main surface 2b of the substrate 2 and at least one of the first detection electrodes 3a, the second detection electrodes 4a, and the first connecting electrodes 3b.

In the first to third embodiments, examples of the input devices X1 to X3 with which input operation is performed through the protective sheet 11 on the first main surface 2a of the substrate 2 are described. However, these examples are not limiting. That is, the input operation may be performed on the second main surface 2b of the substrate 2 through the protective member 12. In this case, the protective sheet 11 need not be formed on the first main surface 2a of the substrate 2. A protective sheet may be formed on the protective member 12. If the input device is an input device with which input operation is performed on the second main surface 2b of the substrate 2 through the protective member 12, a constitutional member of the display panel may be formed on the first main surface 2a of the substrate 2. In the case where the display panel is a liquid crystal panel 2, the constitutional member of the display panel may be, for example a color filter, a black matrix, or a common electrode. In other words, the input device may be of an on-cell type.

Although examples of the display device Y1 that includes the input device X1 are described above, the input device X2 or the input device X3 may be employed instead of the input device X1. A portable terminal that includes a display device that includes the input device X2 or the input device X3 may also be employed.

REFERENCE SIGNS LIST

X1 to X3 input device
Y1 display device
P1 portable terminal (electronic apparatus)
2 substrate
3a first detection electrode
3b first connecting electrode
4a second detection electrode
4b second connecting electrode
5 first insulating layer
6, 61, 62 second insulating layer
7 detection wire
8 third insulating layer
13 light-shielding layer
14 light-scattering member
101 liquid crystal panel (display panel)
104 first casing (casing)

The invention claimed is:

1. An input device comprising:
a substrate comprising a main surface;
first detection electrodes on the main surface of the substrate, aligned in a first direction;
second detection electrodes on the main surface of the substrate, aligned in a second direction;
a first connecting electrode on the main surface of the substrate, connecting neighboring two of the first detection electrodes;
a first insulating layer on the main surface of the substrate, located on the first connecting electrode;
a second connecting electrode on the first insulating layer, connecting neighboring two of the second detection electrodes; and
a second insulating layer disposed between the main surface of the substrate and at least one of the first detection electrodes, the second detection electrodes, and the first connecting electrode, wherein at least one of the first detection electrodes, the second detection electrodes, and the first connecting electrode does not directly contact with the main surface, wherein the second insulating layer is disposed between the first detection electrodes and the main surface of the substrate and between the second detection electrodes and the main surface of the substrate, wherein the second insulating layer separates the main surface of the substrate from the first detection electrodes and the second detection electrodes, but is not disposed between the first connecting electrode and the main surface of the substrate.

2. The input device according to claim 1, wherein a height position of the first detection electrodes and the second detection electrodes with respect to the main surface of the substrate is substantially the same as a height position of the second connecting electrode with respect to the main surface of the substrate.

3. The input device according to claim 1, further comprising:
   detection wires disposed on the main surface of the substrate and electrically connected to the first detection electrodes or the second detection electrodes; and
   a third insulating layer disposed between the detection wires and the main surface of the substrate, the third insulating layer separating the detection wires from the main surface of the substrate.

4. The input device according to claim 3, wherein the third insulating layer is separated from a main-surface-side edge of an end surface of the substrate.

5. The input device according to claim 3, further comprising:
   a light-shielding layer between the main surface of the substrate and the third insulating layer,
   wherein at least a part of the detection wires are disposed on the light-shielding layer with the third insulating layer therebetween.

6. The input device according to claim 3, further comprising:
   a light-shielding layer on the third insulating layer,
   wherein at least a part of the detection wires are disposed on the light-shielding layer.

7. The input device according to claim 1, wherein the substrate is composed of a strengthened glass chemically strengthened by ion exchange.

8. A display device comprising:
   the input device according to claim 1;
   a display panel arranged to face the input device; and
   a casing that houses the display panel.

9. The display device according to claim 8, wherein the display panel is a liquid crystal panel or an organic EL panel.

10. An electronic apparatus comprising the display device according to claim 8.

11. An input device comprising:
   a substrate comprising a main surface;
   first and second detection electrodes on the main surface, aligned in a first direction;
   third and fourth detection electrodes on the main surface, aligned in a second direction that is different from the first direction;
   a first connecting electrode on the main surface, connecting the first detection electrode with the second detection electrode;
   a first insulating layer on the main surface, located on the first connecting electrode;
   a second connecting electrode on the first insulating layer, connecting the third detection electrode with the fourth detection electrode; and
   a second insulating layer disposed between the main surface and at least one of the first and second detection electrodes, the third and fourth detection electrodes and the first connecting electrode,
   wherein at least one of the first and second detection electrodes, the third and fourth detection electrodes and the first connecting electrode does not directly contact with the main surface, wherein the second insulating layer is disposed between the first and second detection electrodes and the main surface of the substrate and between the third and fourth detection electrodes and the main surface of the substrate, wherein the second insulating layer separates the main surface of the substrate from the first and second detection electrodes and the third and fourth detection electrodes, but is not disposed between the first connecting electrode and the main surface of the substrate.

* * * * *